US012237383B2

United States Patent
Kim et al.

(10) Patent No.: US 12,237,383 B2
(45) Date of Patent: Feb. 25, 2025

(54) INTEGRATED CIRCUIT DEVICE

(71) Applicant: Samsung Electronics Co., Ltd., Suwon-si (KR)

(72) Inventors: Dohee Kim, Seoul (KR); Gyeom Kim, Hwaseong-si (KR); Jinbum Kim, Seoul (KR); Jaemun Kim, Seoul (KR); Seunghun Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 690 days.

(21) Appl. No.: 17/404,078

(22) Filed: Aug. 17, 2021

(65) Prior Publication Data

US 2022/0238666 A1  Jul. 28, 2022

(30) Foreign Application Priority Data

Jan. 27, 2021 (KR) .................. 10-2021-0011807

(51) Int. Cl.
*H01L 29/417* (2006.01)
*H01L 27/088* (2006.01)
*H01L 29/78* (2006.01)

(52) U.S. Cl.
CPC .... *H01L 29/41775* (2013.01); *H01L 27/0886* (2013.01); *H01L 29/7851* (2013.01)

(58) Field of Classification Search
CPC ......... H01L 29/66545; H01L 21/28518; H01L 21/28537; H01L 21/76844; H01L 21/76846; H01L 27/0886; H01L 29/7851; H01L 29/41775

See application file for complete search history.

(56) References Cited

U.S. PATENT DOCUMENTS

| 6,989,322 | B2 | 1/2006 | Gluschenkov et al. |
| 8,048,737 | B2 | 11/2011 | Kim et al. |
| 8,643,122 | B2 | 2/2014 | Alptekin et al. |
| 9,673,295 | B2 | 6/2017 | Levesque et al. |

(Continued)

FOREIGN PATENT DOCUMENTS

TW  201438244 A  10/2014

OTHER PUBLICATIONS

Office Action dated Dec. 10, 2024 issued in corresponding Taiwanese Patent Application No. 110141464.

*Primary Examiner* — Syed I Gheyas
*Assistant Examiner* — Casey Paul Boatman
(74) *Attorney, Agent, or Firm* — Harness, Dickey & Pierce, P.L.C.

(57) ABSTRACT

An integrated circuit (IC) device includes a fin-type active region extending in a first lateral direction on a substrate, a gate line extending in a second lateral direction on the fin-type active region, an insulating spacer covering a sidewall of the gate line, a source/drain region at a position adjacent to the gate line, a metal silicide film covering a top surface of the source/drain region, and a source/drain contact apart from the gate line with the insulating spacer therebetween in the first lateral direction. The source/drain contact includes a bottom contact segment being in contact with a top surface of the metal silicide film and an upper contact segment integrally connected to the bottom contact segment. A width of the bottom contact segment is greater than a width of at least a portion of the upper contact segment in the first lateral direction.

18 Claims, 32 Drawing Sheets

(56) References Cited

U.S. PATENT DOCUMENTS

| | | | |
|---|---|---|---|
| 9,935,188 B2 | 4/2018 | Blanchard et al. | |
| 10,043,902 B2 | 8/2018 | Shin et al. | |
| 10,714,578 B2 | 7/2020 | Huang | |
| 10,727,347 B2 | 7/2020 | Huang et al. | |
| 2013/0119483 A1* | 5/2013 | Alptekin | H01L 21/28518 |
| | | | 257/408 |
| 2019/0019864 A1* | 1/2019 | Lee | H01L 21/823468 |
| 2019/0097039 A1* | 3/2019 | Huang | H01L 29/785 |
| 2019/0148522 A1* | 5/2019 | Wu | H01L 29/66795 |
| | | | 257/365 |
| 2019/0157141 A1* | 5/2019 | Liao | H01L 21/28518 |
| 2019/0371898 A1* | 12/2019 | Huang | H01L 29/7853 |
| 2020/0006577 A1* | 1/2020 | Ching | H01L 29/0847 |
| 2020/0111739 A1 | 4/2020 | Cheng et al. | |
| 2020/0119000 A1* | 4/2020 | Wang | H01L 27/0886 |
| 2021/0193797 A1* | 6/2021 | Xie | H01L 29/0665 |

\* cited by examiner

INTEGRATED CIRCUIT DEVICE

CROSS-REFERENCE TO RELATED APPLICATION

This application is based on and claims priority under 35 U.S.C. § 119 to Korean Patent Application No. 10-2021-0011807, filed on Jan. 27, 2021, in the Korean Intellectual Property Office, the disclosure of which is incorporated by reference herein in its entirety.

BACKGROUND

The inventive concept relates to an integrated circuit (IC) device, and more particularly, to an IC device including a field-effect transistor (FET).

In recent years, as the downscaling of IC devices has progressed rapidly, the IC devices need to ensure not only high operation speed but also operation accuracy. Accordingly, there is a need to develop an IC device having a structure capable of improving reliability by improving electrical properties in a device region with a reduced area.

SUMMARY

The inventive concept provides an integrated circuit (IC) device, which has a structure capable of improving electrical properties and reliability while having a device region with a reduced area due to the downscaling of IC devices.

According to an aspect of the inventive concept, there is provided an IC circuit device including a fin-type active region extending long in a first lateral direction on a substrate, a gate line extending long in a second lateral direction on the fin-type active region, wherein the second lateral direction intersects with the first lateral direction, an insulating spacer covering a sidewall of the gate line, a source/drain region on the fin-type active region at a position adjacent to the gate line, a metal silicide film covering a top surface of the source/drain region, a source/drain contact apart from the gate line with the insulating spacer therebetween in the first lateral direction, the source/drain contact being connected to the source/drain region through the metal silicide film, wherein the source/drain contact includes a bottom contact segment and an upper contact segment, the bottom contact segment having a contact surface in contact with a top surface of the metal silicide film, the upper contact segment being apart from the metal silicide film with the bottom contact segment therebetween in a vertical direction, the upper contact segment being integrally connected to the bottom contact segment, wherein a width of the bottom contact segment is greater than a width of at least a portion of the upper contact segment in the first lateral direction.

According to another aspect of the inventive concept, there is provided an IC device including a fin-type active region extending long in a first lateral direction on a substrate, a recess region in the fin-type active region, a pair of gate lines apart from each other with the recess region therebetween, the pair of gate lines extending long in a second lateral direction on the fin-type active region, wherein the second lateral direction intersects with the first lateral direction, a pair of insulating spacers covering sidewalls of each of the pair of gate lines, a source/drain region in the recess region, a metal silicide film covering a top surface of the source/drain region, a source/drain contact between the pair of gate lines and connected to the source/drain region through the metal silicide film, wherein the source/drain contact includes a bottom contact segment and an upper contact segment, the bottom contact segment having a contact surface in contact with a top surface of the metal silicide film, the upper contact segment being apart from the metal silicide film with the bottom contact segment therebetween in a vertical direction, the upper contact segment being integrally connected to the bottom contact segment, wherein a width of the bottom contact segment is greater than a width of at least a portion of the upper contact segment in the first lateral direction.

According to another aspect of the inventive concept, there is provided an IC device including a fin-type active region extending long on a substrate in a first lateral direction, a recess region in the fin-type active region, a pair of nanosheet stacks on a fin top surface of the fin-type active region, the pair of nanosheet stacks being apart from each other with the recess region therebetween in the first lateral direction, a pair of gate lines surrounding the pair of nanosheet stacks on the fin-type active region, the pair of gate lines extending long in a second lateral direction that intersects with the first lateral direction, a pair of insulating spacers respectively covering sidewalls of the pair of gate lines, a source/drain region in the recess region, a metal silicide film covering a top surface of the source/drain region, a source/drain contact between the pair of gate lines, the source/drain contact being connected to the source/drain region through the metal silicide film, wherein the source/drain contact includes a bottom contact segment and an upper contact segment, the bottom contact segment having a contact surface in contact with a top surface of the metal silicide film, the upper contact segment being apart from the metal silicide film with the bottom contact segment therebetween in a vertical direction, the upper contact segment being integrally connected to the bottom contact segment, wherein a width of the bottom contact segment is greater than a width of at least a portion of the upper contact segment in the first lateral direction.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
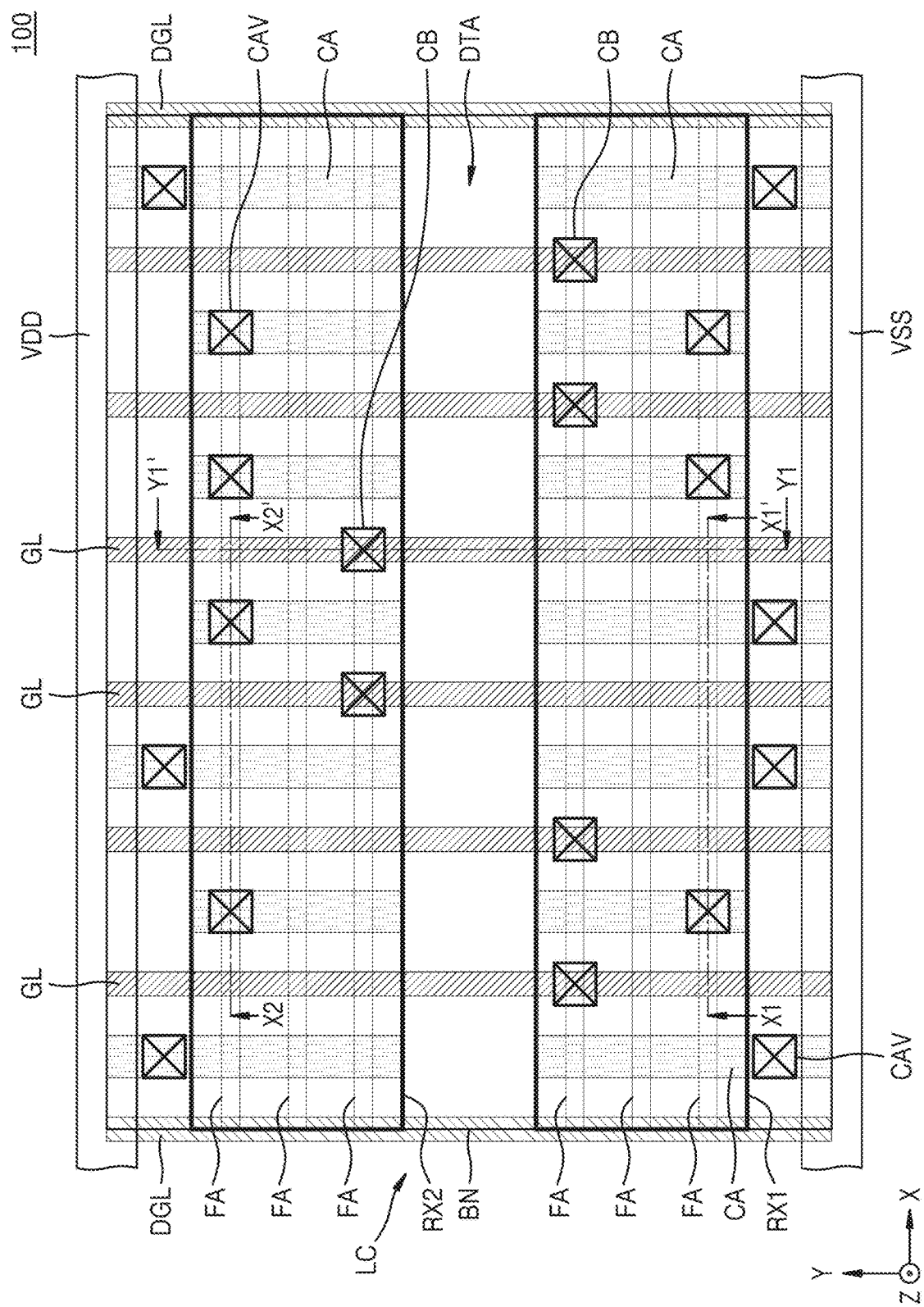
FIG. 1 is a plan layout diagram of an integrated circuit (IC) device according to some example embodiments.

Hereinafter, some example embodiments will be described in detail with reference to the accompanying drawings. The same reference numerals are used to denote the same elements in the drawings, and repeated descriptions thereof will be omitted.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 2A:
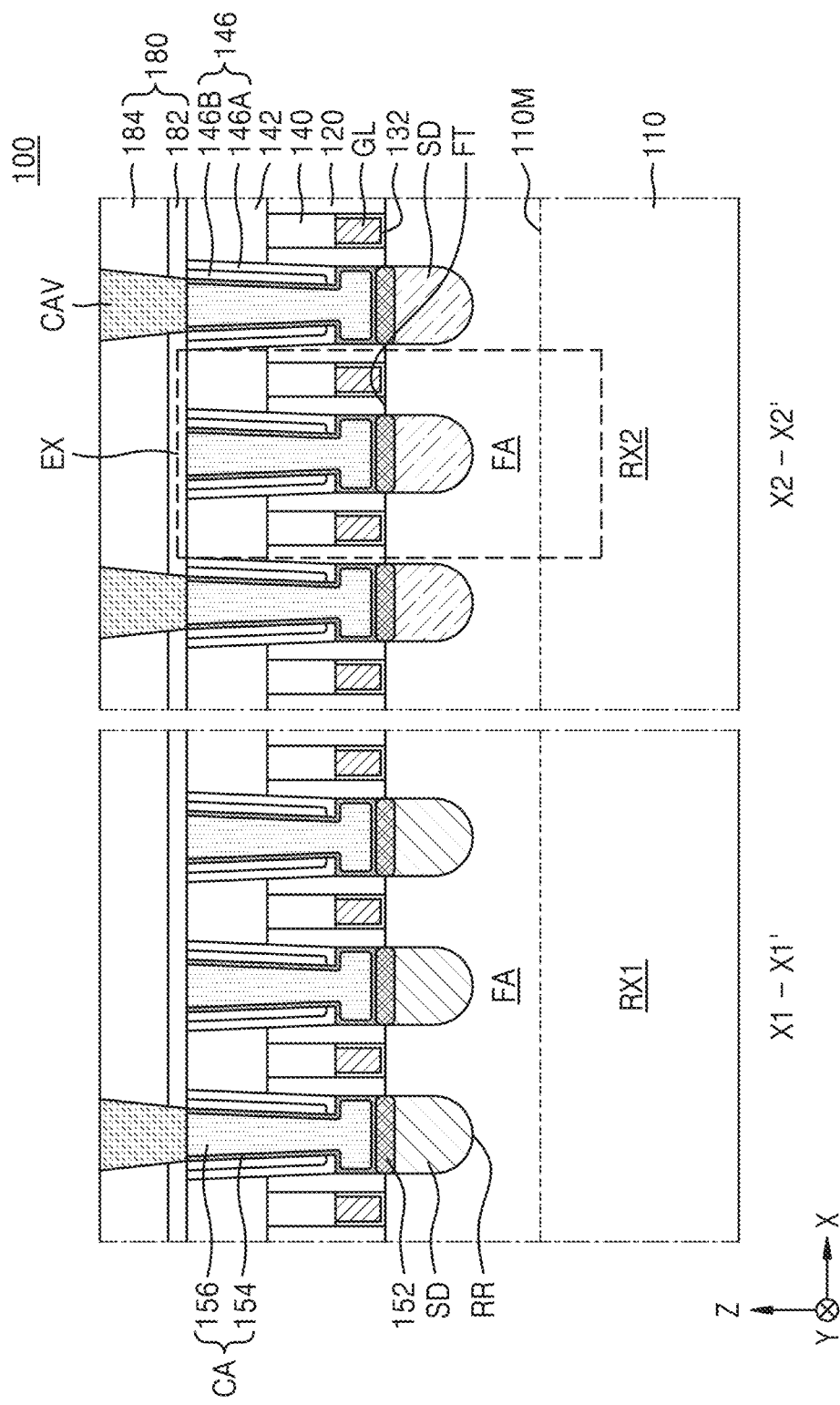
FIG. 2A is a cross-sectional view of some components corresponding to a cross-section taken along a line X1-X1' of FIG. 1 and a cross-section taken along a line X2-X2' of FIG. 1.
Figure 2B:
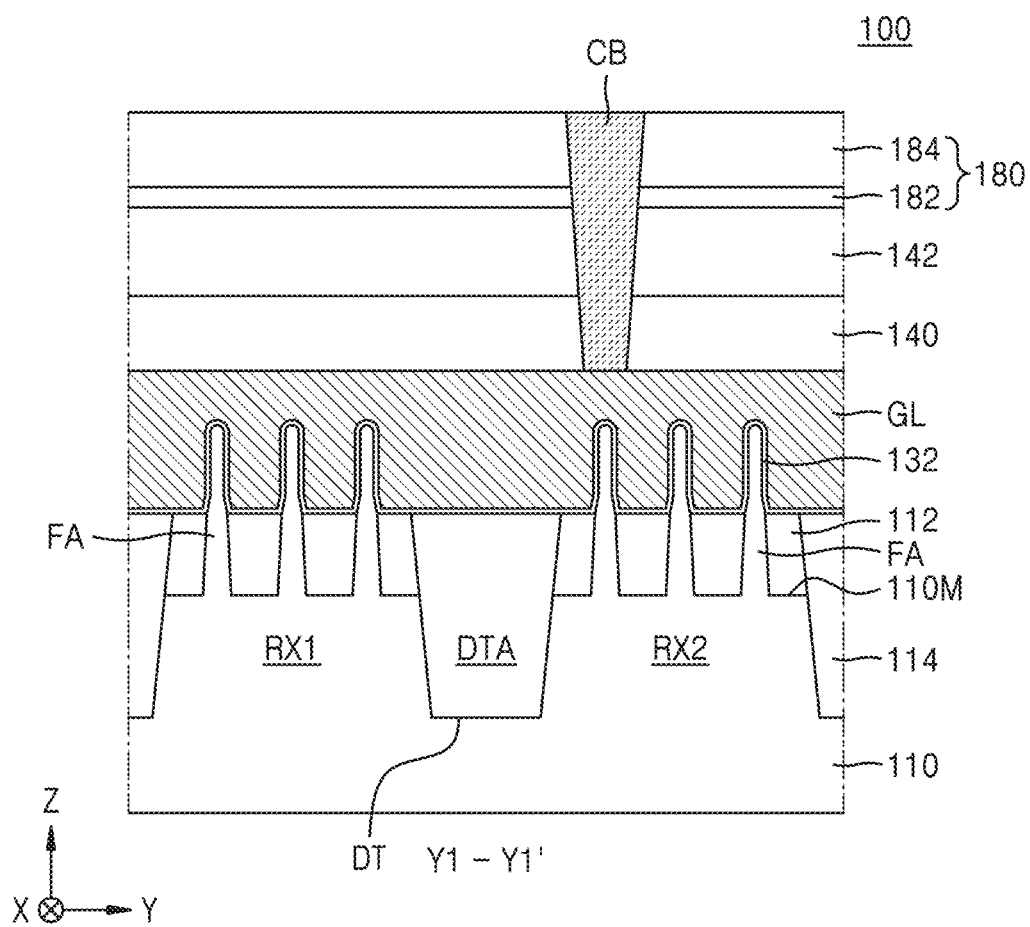
FIG. 2B is a cross-sectional view of some components corresponding to a cross-section taken along a line Y1-Y1' of FIG. 1.
Figure 2C:
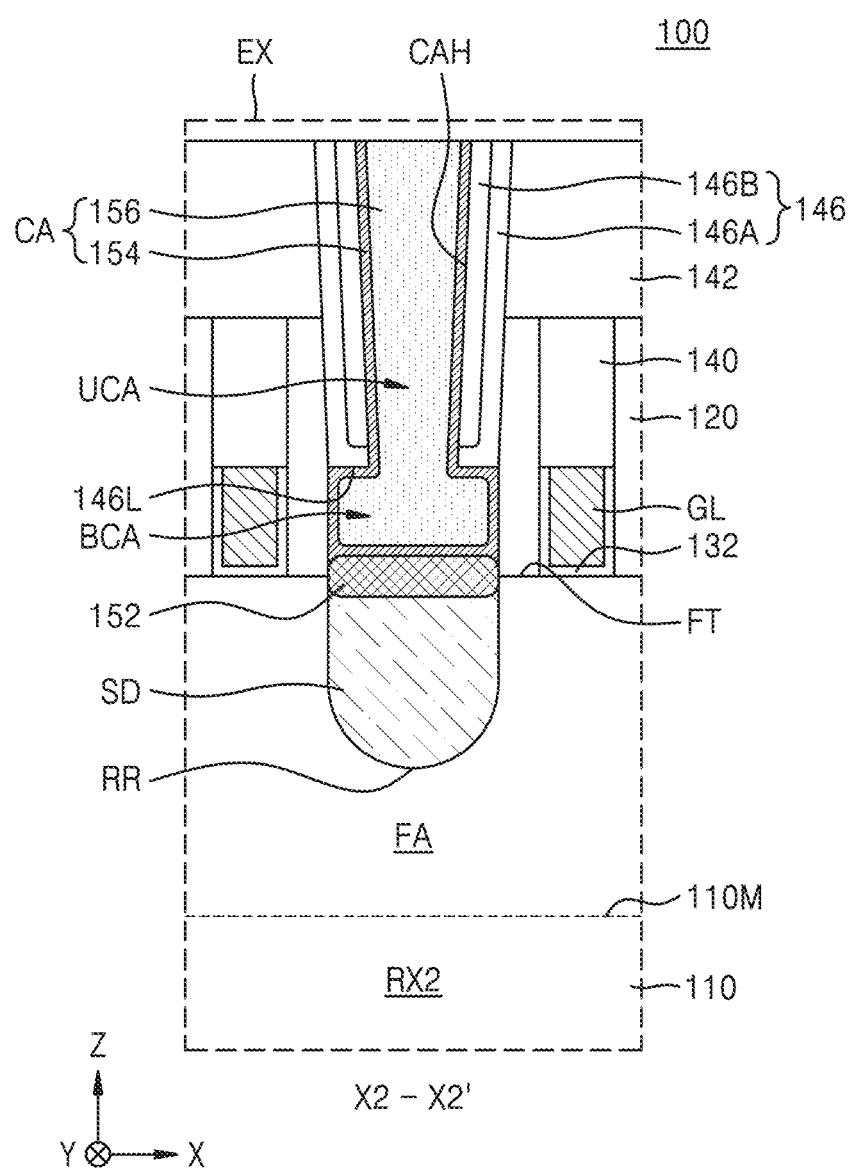
FIG. 2C is an enlarged cross-sectional view of region "EX" of FIG. 2A.

FIG. 1 is a plan layout diagram of an integrated circuit (IC) device 100 according to some example embodiments. FIG. 2A is a cross-sectional view of some components corresponding to a cross-section taken along a line X1-X1' of FIG. 1 and a cross-section taken along a line X2-X2' of FIG. 1. FIG. 2B is a cross-sectional view of some components corresponding to a cross-section taken along a line Y1-Y1' of FIG. 1. FIG. 2C is an enlarged cross-sectional view of region "EX" of FIG. 2A.

Referring to FIGS. 1 and 2A to 2C, the IC device 100 may include a logic cell LC including a fin field effect transistor (FinFET) device. The IC device 100 may include the logic cell LC formed in a region defined by a cell boundary BN on a substrate 110.

The substrate 110 may have a main surface 110M, which extends in a lateral direction (X-Y plane direction). The substrate 110 may include a semiconductor, such as silicon (Si) or germanium (Ge), and/or a compound semiconductor, such as silicon germanium (SiGe), silicon carbide (SiC), gallium arsenide (GaAs), indium arsenide (InAs), or indium phosphide (InP). The substrate 110 may include a conductive region, for example, a doped well or a doped structure.

The logic cell LC may include a first device region RX1 and a second device region RX2. A plurality of fin-type active regions FA may be formed in the first device region RX1 and the second device region RX2 and each protrude from the substrate 110. The plurality of fin-type active regions FA may extend parallel to each other in a widthwise direction of the logic cell LC, that is, a first lateral direction (X direction).

As shown in FIG. 2B, a device isolation film 112 may be formed on the substrate 110 between the plurality of fin-type active regions FA in the first device region RX1 and the second device region RX2. The plurality of fin-type active regions FA may each protrude as a fin type over the device isolation film 112 in the first device region RX1 and the second device region RX2. A device isolation region DTA may be between the first device region RX1 and the second device region RX2. A deep trench DT may be formed in the device isolation region DTA to define the first device region RX1 and the second device region RX2, and the deep trench DT may be filled with a device isolation insulating film 114. Each of the device isolation film 112 and the device isolation insulating film 114 may include an oxide film.

A plurality of gate insulating films 132 and a plurality of gate lines GL may extend on the substrate 110 in a height direction of the logic cell LC (i.e., a second lateral direction (Y direction), which intersects with the plurality of fin-type active regions FA. The plurality of gate insulating films 132 and the plurality of gate lines GL may cover a top surface and both sidewalls of each of the plurality of fin-type active regions FA, a top surface of the device isolation film 112, and a top surface of the device isolation insulating film 114.

A plurality of MOS transistors may be formed along the plurality of gate lines GL in the first device region RX1 and the second device region RX2. Each of the plurality of MOS transistors may include a three-dimensional (3D) MOS transistor of which a channel is formed on a top surface and both sidewalls of the fin-type active regions FA. In some example embodiments, the first device region RX1 may be an NMOS transistor region, and a plurality of NMOS transistors may be formed at intersections between the fin-type active regions FA and the gate lines GL in the first device region RX1. The second device region RX2 may be a PMOS transistor region, and a plurality of PMOS transistors may be formed at intersections between the fin-type active regions FA and the gate lines GL in the second device region RX2.

A dummy gate line DGL may extend along a cell boundary BN, which extends in the second lateral direction (Y direction). The dummy gate line DGL may include the same material as the plurality of gate lines GL. During an operation of the IC device 100, the dummy gate line DGL may remain electrically floated and serve as an electrical isolation region between the logic cell and other logic cells adjacent thereto. The plurality of gate lines GL and a plurality of dummy gate lines DGL may have the same width in a first lateral direction (X direction) and be arranged at a constant pitch in the first lateral direction (X direction).

The plurality of gate insulating films 132 may include a silicon oxide film, a high-k dielectric film, or a combination thereof. The high-k dielectric film may include a material having a higher dielectric constant than a silicon oxide film. The high-k dielectric film may include a metal oxide or a metal oxynitride. An interface film (not shown) may be between the fin-type active regions FA and the gate insulating films 132. The interface film may include an oxide film, a nitride film, and/or an oxynitride film.

The plurality of gate lines GL and the plurality of dummy gate lines DGL may have a structure in which a metal nitride layer, a metal layer, a conductive capping layer, and a gap-fill metal film are sequentially stacked. The metal nitride layer and the metal layer may include at least one metal selected from titanium (Ti), tantalum (Ta), tungsten (W), ruthenium (Ru), niobium (Nb), molybdenum (Mo), and/or hafnium (Hf). The gap-fill metal film may include a tungsten film or an aluminum (Al) film. The plurality of gate lines GL and the plurality of dummy gate lines DGL may each include a work-function metal-containing layer. The work-function metal-containing layer may include at least one metal selected from titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). In some example embodiments, each of the plurality of gate lines GL and the plurality of dummy gate lines DGL may include a stack structure of titanium aluminum carbide/titanium nitride/tungsten (TiAlC/TiN/W), a stack structure of titanium nitride/tantalum nitride/titanium aluminum carbide/titanium nitride/tungsten (TiN/TaN/TiAlC/TiN/W), or a stack structure of TiN/TaN/TiN/TiAlC/TiN/W, without being limited thereto.

A top surface of each of the plurality of gate lines GL, the plurality of dummy gate lines DGL, and the plurality of gate insulating films 132 may be covered by an insulating capping line 140. A plurality of insulating capping lines 140 may include a silicon nitride film.

A plurality of insulating spacers 120 may respectively cover both sidewalls of the plurality of gate lines GL, the plurality of dummy gate lines DGL, and the plurality of the insulating capping lines 140. Each of the insulating capping lines 140 and the plurality of insulating spacers 120 may extend as a line type in the second lateral direction (Y direction), which is a lengthwise direction of the logic cell LC. Each of the plurality of insulating spacers 120 may include silicon nitride (SiN), silicon carbonitride (SiCN), silicon boron nitride (SiBN), silicon oxynitride (SiON), silicon oxycarbonitride (SiOCN), silicon boron carbonitride (SiBCN), or a combination thereof, without being limited thereto. As used herein, each of the terms "SiN," "SiCN," "SiBN," "SiON," "SiOCN," and "SiBCN" refers to a material including elements included therein, without referring to a chemical formula representing a stoichiometric relationship.

A plurality of recess regions RR may be formed in top surfaces of the plurality of fin-type active regions FA. The plurality of gate lines GL may include a pair of gate lines GL, which are adjacent to one recess region RR and apart from each other with the one recess region RR therebetween. A plurality of source/drain regions SD may be formed in the plurality of recess regions RR. At least some of the plurality of source/drain regions SD may be between a pair of gate lines GL. The gate line GL and the source/drain region SD may be apart from each other with the gate insulating film 132 and the insulating spacer 120 therebetween.

The plurality of source/drain regions SD may include semiconductor epitaxial layers epitaxially grown from the plurality of recess regions RR formed in the fin-type active regions FA. The plurality of source/drain regions SD may include an epitaxially grown Si layer, an epitaxially grown SiC layer, or a plurality of epitaxially grown SiGe layers. When the first device region RX1 is an NMOS transistor region and the second device region RX2 is a PMOS transistor region, the plurality of source/drain regions SD in the first device region RX1 may include a Si layer doped with an n-type dopant or a SiC layer doped with an n-type dopant, the plurality of source/drain regions SD in the second device region RX2 may include a SiGe layer doped with a p-type dopant. The n-type dopant may be selected from phosphorus (P), arsenic (As), and/or antimony (Sb). The p-type dopant may be selected from boron (B) and/or gallium (Ga).

In some example embodiments, the plurality of source/drain regions SD in the first device region RX1 may have a different shape and size from the plurality of source/drain regions SD in the second device region RX2. A shape of each of the plurality of source/drain regions SD is not limited to the example shown in FIGS. 2A and 2C, and a plurality of source/drain regions SD having various shapes and sizes may be formed in the first device region RX1 and the second device region RX2.

A plurality of metal silicide films 152 may be formed on the plurality of source/drain regions SD. The plurality of metal silicide films 152 may respectively cover top surfaces of the source/drain regions SD. In some example embodiments, each of the plurality of metal silicide films 152 may include Ti, W, Ru, Nb, Mo, Hf, Ni, Co, Pt, Yb, Tb, Dy, Er, and/or Pd. For example, the metal silicide film 152 may include titanium silicide.

A plurality of source/drain contacts CA may be respectively formed on the plurality of metal silicide films 152. The source/drain contact CA may be apart from the gate line GL with the insulating spacer 120 therebetween in the first lateral direction (X direction). The source/drain contact CA may be connected to the source/drain region SD through the metal silicide film 152. Each of the plurality of source/drain regions SD may be connected to an upper conductive line (not shown) through the metal silicide film 152 and the source/drain contact CA.

Each of the plurality of source/drain contacts CA may include a conductive barrier film 154 and a metal plug 156. The conductive barrier film 154 may surround an outer surface of the metal plug 156. The conductive barrier film 154 may include Ti, Ta, TiN, TaN, or a combination thereof, and the metal plug 156 may include W, Co, Cu, Ru, Mn, or a combination thereof, without being limited thereto.

As shown in FIGS. 2A and 2C, each of the plurality of source/drain contacts CA may include a bottom contact unit BCA (also called a bottom contact segment BCA) and an upper contact unit UCA (also called an upper contact segment UCA). The bottom contact unit BCA may have a contact surface in contact with a top surface of the metal silicide film 152. The upper contact unit UCA may be apart from the metal silicide film 152 with the bottom contact unit BCA therebetween in a vertical direction (Z direction). The bottom contact unit BCA may be integrally connected to the upper contact unit UCA. That is, the conductive barrier film 154 included in the bottom contact unit BCA may be integrally connected to the conductive barrier film 154 included in the upper contact unit UCA, and the metal plug 156 included in the bottom contact unit BCA may be integrally connected to the metal plug 156 included in the upper contact unit UCA. A width of the bottom contact unit BCA may be greater than a width of at least a portion of the upper contact unit UCA in the first lateral direction (X direction). In some example embodiments, in the first lateral direction (X direction), a width of the bottom contact unit BCA may be greater than a width of an entire portion of the upper contact unit UCA.

The bottom contact unit BCA of the source/drain contact CA may include portions protruding from a lower end of the upper contact unit UCA toward the gate line GL. In some example embodiments, the bottom contact unit BCA of the source/drain contact CA may include portions, which protrude in opposite directions from the lower end of the upper contact unit UCA toward a pair of gate lines GL, which are adjacent to each other on both sides of the bottom contact unit BCA in the first lateral direction (X direction). The bottom contact unit BCA may face the pair of gate lines GL on both sides of the bottom contact unit BCA in the first lateral direction (X direction).

In the first lateral direction (X direction), a width of a contact surface of the bottom contact unit BCA with the metal silicide film 152 may be substantially equal to a width of the metal silicide film 152. In the first lateral direction (X direction), the width of the contact surface of the bottom contact unit BCA with the metal silicide film 152 may be greater than a minimum width of the upper contact unit UCA. In some example embodiments, in the first lateral direction (X direction), a maximum width of the metal silicide film 152 may be greater than a maximum width of the source/drain contact CA.

Each of the bottom contact unit BCA of the source/drain contact CA and the metal silicide film 152 may include a portion in contact with the insulating spacer 120. The bottom contact unit BCA and the metal silicide film 152 may be respectively in contact with a pair of insulating spacers 120, which are adjacent to each other on both sides of the metal silicide film 152 in the first lateral direction (X direction). A width of the metal silicide film 152 in the first lateral direction (X direction) may correspond to a distance between the pair of insulating spacers 120, which are adjacent to each other on both sides of the metal silicide film 152, in the first lateral direction (X direction).

A portion of the metal silicide film 152 may be at a lower level than a fin top surface FT of the fin-type active region FA, and another portion of the metal silicide film 152 may be at a higher level than the fin top surface FT of the fin-type active region FA. The metal silicide film 152 may be in contact with a top surface of the source/drain region SD at a lower level than the fin top surface FT of the fin-type active region FA.

An insulating liner 146 may be between the insulating spacer 120 and the upper contact unit UCA of the source/drain contact CA. The insulating liner 146 may surround a sidewall of the source/drain contact CA at a level higher than an uppermost level of the metal silicide film 152. As used herein, the term "level" refers to a height from a top surface of the substrate 102 in a vertical direction (Z direction or −Z direction). The bottom contact unit BCA of the source/drain contact CA may include a portion between the metal silicide film 152 and the insulating liner 146 in the vertical direction (Z direction). The insulating liner 146 may not include a portion between the bottom contact unit BCA of the source/drain contact CA and the insulating spacer 120.

The insulating liner 146 may include a first insulating liner 146A and a second insulating liner 146B, which sequentially cover a sidewall of the insulating spacer 120. In some example embodiments, each of the first insulating liner 146A and the second insulating liner 146B may include a silicon nitride film. A silicon nitride film included in the first insulating liner 146A may have a different density from a silicon nitride film included in the second insulating liner 146B. To obtain the above-described structure, the first insulating liner 146A and the second insulating liner 146B may be formed using different deposition methods. A method of forming the first insulating liner 146A and the second insulating liner 146B will be described in detail below with reference to FIG. 11G. In other example embodiments, each of the first insulating liner 146A and the second insulating liner 146B may include SiN, SiCN, SiBN, SiON, SiOCN, SiBCN, or a combination thereof, without being limited thereto.

Although FIGS. 2A and 2C illustrate an example in which the insulating liner 146 has a double layer structure including the first insulating liner 146A and the second insulating liner 146B, which sequentially cover a sidewall of the insulating spacer 120, the inventive concepts are not limited thereto. For example, the insulating liner 146 may include a single layer or a multilayered structure including at least a triple film.

The insulating liner 146 may have a bottom surface 146L facing the substrate 110. The bottom surface 146L of the insulating liner 146 may have a horizontal plane, which extends parallel to the substrate 110 in the first lateral direction (X direction) at a position apart from the metal silicide film 152 in the vertical direction (Z direction).

The IC device 100 may include an upper insulating film 142, which covers a top surface of each of the plurality of insulating spacers 120 and the plurality of insulating capping lines 140. The source/drain contact CA and the insulating liner 146 may be formed inside a source/drain contact hole CAH, which passes through the upper insulating film 142 in the vertical direction (Z direction). In some example embodiments, the upper insulating film 142 may include a silicon oxide film.

As shown in FIGS. 2A and 2B, the upper insulating film 142, the plurality of source/drain contacts CA, and a plurality of insulating liners 146 may be covered by an insulating structure 180. The insulating structure 180 may include an etch stop film 182 and an interlayer insulating film 184, which are sequentially stacked on the source/drain contact CA and the upper insulating film 142. The etch stop film 182 may include silicon carbide (SiC), silicon nitride (SiN), nitrogen-doped silicon carbide (SiC:N), silicon oxycarbide (SiOC), aluminum nitride (AlN), aluminum oxynitride (AlON), aluminum oxide (AlO), aluminum oxycarbide (AlDC), or a combination thereof. The interlayer insulating film 184 may include an oxide film, a nitride film, an ultralow-k (ULK) film having an ultralow dielectric constant K of about 2.2 to about 2.4, or a combination thereof. For example, the interlayer insulating film 184 may include a tetraethylorthosilicate (TEOS) film, a high-density plasma (HDP) oxide film, a boro-phospho-silicate glass (BPSG) film, a flowable chemical vapor deposition (FCVD) oxide film, a SiON film, a SiN film, a SiOC film, a SiCOH film, or a combination thereof, without being limited thereto.

A plurality of via contacts CAV may be formed on the plurality of source/drain contacts CA. Each of the plurality of via contacts CAV may pass through the insulating structure 180 and be in contact with the source/drain contact CA.

A plurality of gate contacts CB may be formed on the plurality of gate lines GL. Each of the plurality of gate contacts CB may pass through the insulating structure 180, the upper insulating film 142, and the insulating capping line 140 and be in contact with a top surface of the gate line GL.

Each of the plurality of via contacts CAV and the plurality of gate contacts CB may include a buried metal film and a conductive barrier film surrounding the buried metal film. The buried metal film may include cobalt (Co), copper (Cu), tungsten (W), ruthenium (Ru), manganese (Mn), or a combination thereof, and the conductive barrier film may include titanium (Ti), tantalum (Ta), titanium nitride (TiN), tantalum nitride (TaN), or a combination thereof. Sidewalls of each of the plurality of via contacts CAV and the plurality of gate contacts CB may be covered by an upper insulating liner (not shown). The upper insulating liner may include a silicon nitride film, without being limited thereto.

As shown in FIG. 1, in the logic cell LC, a ground line VSS may be connected to the fin-type active region RX1 in the first device region RX1 through the source/drain contact CA located in the first device region RX1, from among the plurality of source/drain contacts CA, and a power line VDD may be connected to the fin-type active region FA in the second device region RX2 through the source/drain contact CA located in the second device region RX2, from among the plurality of source/drain contacts CA. The ground line VSS and the power line VDD may be at a higher level than a top surface of each of the plurality of source/drain contacts CA and the plurality of gate contacts CB. Each of the ground line VSS and the power line VDD may include a conductive barrier film and a wiring conductive layer. The conductive barrier film may include Ti, Ta, TiN, TaN, or a combination thereof. The wiring conductive layer may include Co, Cu, W, an alloy thereof, or a combination thereof.

The IC device 100 shown in FIGS. 1 and 2A to 2C may include the metal silicide film 152 entirely covering the top surface of the source/drain region SD and the source/drain contact CA on the metal silicide film 152. In addition, the source/drain contact CA may include the bottom contact unit BCA having a relatively great contact surface, which contacts the top surface of the metal silicide film 152 over a relatively great contact area. Thus, even when the IC device 100 has a device region with a reduced area due to the downscaling of IC devices, an insulation distance between the gate line GL and the source/drain contact CA adjacent thereto may be stably ensured or improved in the IC device 100, and a contact resistance between the source/drain region SD and the source/drain contact CA may be reduced. Accordingly, the electrical properties and reliability of the IC device 100 may be improved.

Figure 3:
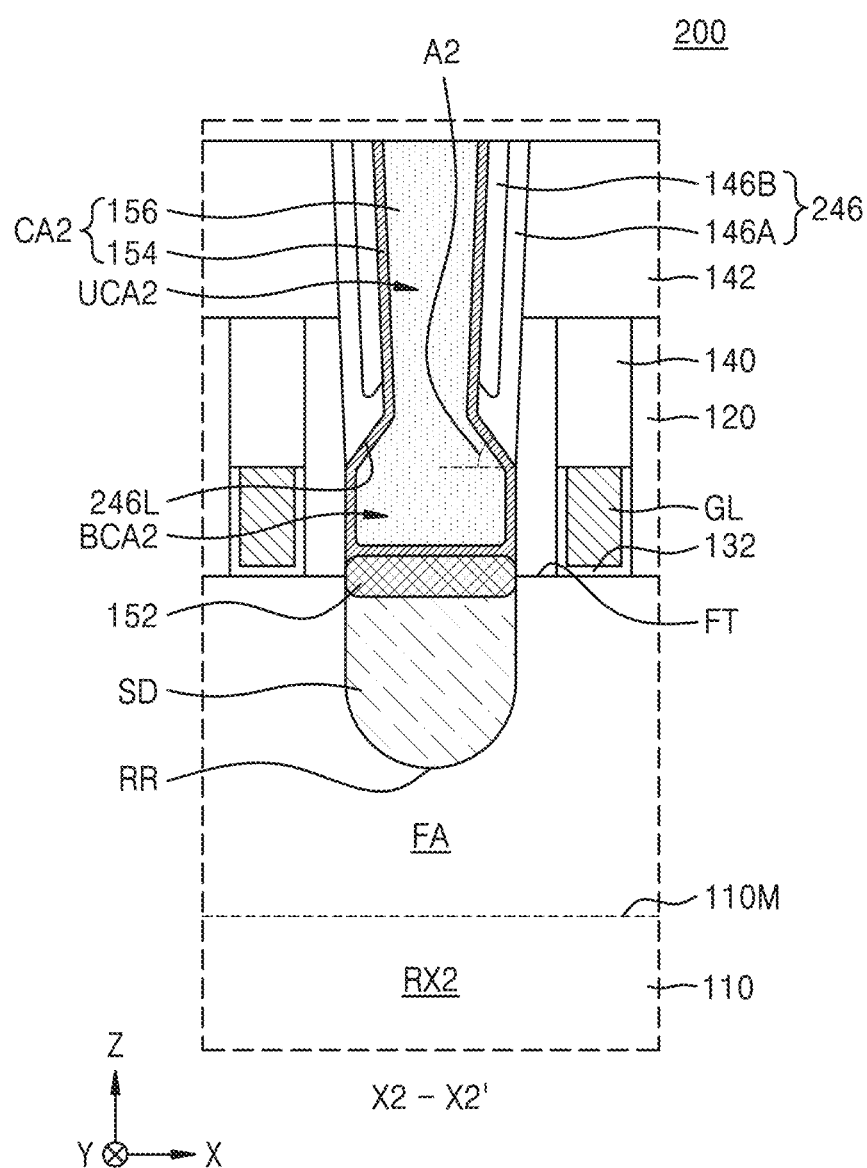
FIG. 3 is a cross-sectional view of an IC device according to some example embodiments.

FIG. 3 is a cross-sectional view of an IC device 200 according to some example embodiments. FIG. 3 is an enlarged cross-sectional view of a portion corresponding to the region "EX" of FIG. 2A in a region of the IC device 200, which corresponds to a cross-section taken along the line X2-X2' of FIG. 1.

Referring to FIG. 3, the IC device 200 may have substantially the same configuration as the IC device 100 described with reference to FIGS. 1 and 2A to 2C. Similar to the IC device 100 described with reference to FIGS. 1 and 2A to 2C, the IC device 200 may include a first device region RX1 and a second device region RX2. Although FIG. 3 illustrates some components of the second device region RX2 of the IC device 200, the first device region RX1 may have substantially the same configuration as described below. However, unlike the IC device 100 described with reference to FIGS. 1 and 2A to 2C, the IC device 200 may include a source/drain contact CA2 formed on the metal silicide film 152 and an insulating liner 246 surrounding the source/drain contact CA2.

The source/drain contact CA2 may have substantially the same configuration as the source/drain contact CA described with reference to FIGS. 2A and 2C. The source/drain contact CA2 may include a conductive barrier film 154 and a metal plug 156. However, the source/drain contact CA2 may include a bottom contact unit BCA2 and an upper contact unit UCA2. The bottom contact unit BCA2 may have a contact surface in contact with a top surface of the metal silicide film 152. The upper contact unit UCA2 may be apart from the metal silicide film 152 with the bottom contact unit BCA2 therebetween in a vertical direction (Z direction). The bottom contact unit BCA2 may be integrally connected to the upper contact unit UCA2. That is, the conductive barrier film 154 included in the bottom contact unit BCA2 may be integrally connected to the conductive barrier film 154 included in the upper contact unit UCA2, and the metal plug 156 included in the bottom contact unit BCA2 may be integrally connected to the metal plug 156 included in the upper contact unit UCA2. In the first lateral direction (X direction), a width of the bottom contact unit BCA2 may be greater than a width of at least a portion of the upper contact unit UCA2. In some example embodiments, in the first lateral direction (X direction), the width of the bottom contact unit BCA2 may be greater than a width of an entire portion of the upper contact unit UCA2.

The bottom contact unit BCA2 of the source/drain contact CA2 may include portions protruding from a lower end of the upper contact unit UCA2 toward the gate line GL. In some example embodiments, the bottom contact unit BCA2 of the source/drain contact CA2 may include portions, which protrude in opposite directions from the lower end of the upper contact unit UCA2 toward the pair of gate lines GL, which are adjacent to each other on both sides of the bottom contact unit BCA2 in the first lateral direction (X direction). The bottom contact unit BCA2 may face the pair of gate lines GL on both sides of the bottom contact unit BCA2 in the first lateral direction (X direction).

The bottom contact unit BCA2 of the source/drain contact CA2 may include a portion in contact with an insulating spacer 120. In some example embodiments, the bottom contact unit BCA2 may be in contact with each of a pair of insulating spacers 120, which are adjacent to the bottom contact unit BCA2 on both sides of the bottom contact unit BCA2. The bottom contact unit BCA2 may be in contact with a top surface of the metal silicide film 152 at a higher level than a fin top surface FT of a fin-type active region FA.

The insulating liner 246 may surround a sidewall of the source/drain contact CA2 at a level higher than an uppermost level of the metal silicide film 152. The insulating liner 246 may be between the insulating spacer 120 of the upper contact unit UCA2 of the source/drain contact CA2 and surround the upper contact unit UCA2. The bottom contact unit BCA2 of the source/drain contact CA2 may include a portion between the insulating liner 246 and the metal silicide film 152 in a vertical direction (Z direction). The insulating liner 246 may include the first insulating liner 146A and the second first insulating liner 146B, without being limited thereto.

The insulating liner 246 may have substantially the same configuration as the insulating liner 146 described with reference to FIGS. 2A and 2C. However, the insulating liner 246 may have a bottom surface 246L facing the substrate 110. The bottom surface 246L of the insulating liner 246 may include an inclined bottom surface that extends in an inclined direction, which intersects with the first lateral direction (X direction), at a position apart from the metal silicide film 152 in the vertical direction (Z direction). The inclined bottom surface included in the bottom surface 246L of the insulating liner 246 may extend in a direction away from the substrate 110 as the inclined bottom surface becomes away from the gate line GL in the first lateral direction (X direction). In some example embodiments, an angle A2 between the inclined bottom surface included in the bottom surface 246L of the insulating liner 246 and a horizontal line parallel to a main surface 110M of the substrate 110 may be in a range of about 30° to about 40°, without being limited thereto.

The bottom contact unit BCA2 of the source/drain contact CA2 may have an inclined outer wall in contact with the inclined bottom surface included in the bottom surface 246L of the insulating liner 246.

In the first lateral direction (X direction), a width of a contact surface of the bottom contact unit BCA2 with the metal silicide film 152 may be substantially equal to a width of the metal silicide film 152. In the first lateral direction (X direction), the width of the contact surface of the bottom contact unit BCA2 with the metal silicide film 152 may be greater than a minimum width of the upper contact unit UCA2. In some example embodiments, in the first lateral direction (X direction), a maximum width of the metal silicide film 152 may be equal to or greater than a maximum width of the source/drain contact CA2.

Each of the bottom contact unit BCA2 of the source/drain contact CA2 and the metal silicide film 152 may include a portion in contact with the insulating spacer 120. The bottom contact unit BCA2 and the metal silicide film 152 may be respectively in contact with a pair of insulating spacers 120, which are adjacent to each other on both sides of the metal silicide film 152.

Figure 4:
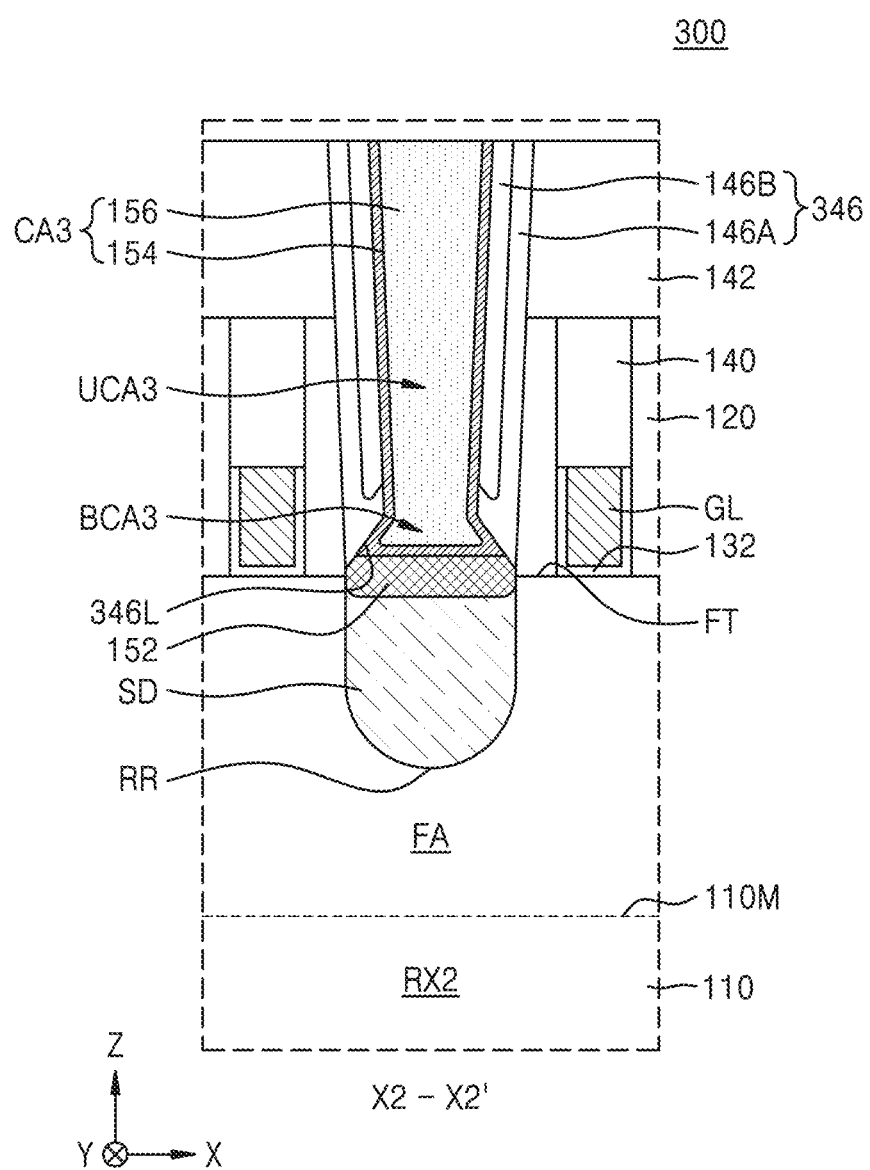
FIG. 4 is a cross-sectional view of an IC device according to some example embodiments.

FIG. 4 is a cross-sectional view of an IC device 300 according to some example embodiments. FIG. 4 is an enlarged cross-sectional view of a portion corresponding to the region "EX" of FIG. 2A in a region of the IC device 300, which corresponds to a cross-section taken along the line X2-X2' of FIG. 1.

Referring to FIG. 4, the IC device 300 may have substantially the same configuration as the IC device 100 described with reference to FIGS. 1 and 2A to 2C. Similar to the IC device 100 described with reference to FIGS. 1 and 2A to 2C, the IC device 300 may include a first device region RX1 and a second device region RX2. Although FIG. 4 illustrates some components of the second device region RX2 of the IC device 300, the first device region RX1 may have substantially the same configuration as described below. However, unlike the IC device 100 described with reference to FIGS. 1 and 2A to 2C, the IC device 300 may include a source/drain contact CA3 formed on a metal silicide film 152 and an insulating liner 346 surrounding the source/drain contact CA3.

The source/drain contact CA3 may have substantially the same configuration as the source/drain contact CA described with reference to FIGS. 2A and 2C. The source/drain contact CA3 may include a conductive barrier film 154 and a metal plug 156. However, the source/drain contact CA3 may include a bottom contact unit BCA3 and an upper contact unit UCA3. The bottom contact unit BCA3 may have a contact surface in contact with a top surface of the metal silicide film 152, and the upper contact unit UCA3 may be apart from the metal silicide film 152 with the bottom contact unit BCA3 therebetween in a vertical direction (Z direction). The bottom contact unit BCA3 may be integrally connected to the upper contact unit UCA3. That is, the conductive barrier film included in the bottom contact unit BCA3 may be integrally connected to the conductive barrier film 154 included in the upper contact unit UCA3, and the metal plug 156 included in the bottom contact unit BCA3 may be integrally connected to the metal plug 156 included in the upper contact unit UCA3. In a first lateral direction (X direction), a width of the bottom contact unit BCA3 may be greater than a width of at least a portion of the upper contact unit UCA3.

The bottom contact unit BCA3 of the source/drain contact CA3 may include portions protruding toward the gate line GL from a lower end of the upper contact unit UCA3. In some example embodiments, the bottom contact unit BCA3 of the source/drain contact CA3 may include portions, which protrude in opposite directions from the lower end of the upper contact unit UCA3 toward the pair of gate lines GL, which are adjacent to each other on both sides of the bottom contact unit BCA3 in the first lateral direction (X direction). The bottom contact unit BCA3 may face the pair of gate lines GL on both sides of the bottom contact unit BCA3 in the first lateral direction (X direction).

The bottom contact unit BCA3 of the source/drain contact CA3 may be apart from an insulating spacer 120 in the first lateral direction (X direction). The bottom contact unit BCA3 may not include a portion in contact with the insulating spacer 120.

The bottom contact unit BCA3 may be in contact with a top surface of the metal silicide film 152 at a higher level than the fin top surface FT of the fin-type active region FA. A width of a contact surface of the bottom contact unit BCA3 with the metal silicide film 152 may be less than a width of the metal silicide film 152 in the first lateral direction (X direction). In the first lateral direction (X direction), a maximum width of the bottom contact unit BCA3 may be greater than a minimum width of the upper contact unit UCA3. In some example embodiments, in the first lateral direction (X direction), a maximum width of the metal silicide film 152 may be greater than a maximum width of the source/drain contact CA3.

The insulating liner 346 may surround a sidewall of the source/drain contact CA3 at a level higher than an uppermost level of the metal silicide film 152. The insulating liner 346 may include a portion between the insulating spacer 120 and the upper contact unit UCA3 of the source/drain contact CA3. A lowest portion of the insulating liner 346 may be closer to the substrate 110 than a lowest portion of the source/drain contact CA3. The bottom contact unit BCA3 of the source/drain contact CA3 may include a portion between the insulating liner 346 and the metal silicide film 152 in the vertical direction (Z direction). The insulating liner 346 may include the first insulating liner 146A and the second first insulating liner 146B, without being limited thereto.

The insulating liner 346 may have substantially the same configuration as the insulating liner 146 described with reference to FIGS. 2A and 2C. However, the insulating liner 346 may have a bottom surface 346L facing the substrate 110. The bottom surface 346L of the insulating liner 346 may include an inclined bottom surface. The inclined bottom surface included in the bottom surface 346L of the insulating liner 346 may extend in a direction away from the substrate 110 as the inclined bottom surface becomes away from the gate line GL in the first lateral direction (X direction). In some example embodiments, an angle between the inclined bottom surface included in the bottom surface 346L of the insulating liner 346 and a horizontal line parallel to a main surface 110M of the substrate 110 may be in a range of about 30° to about 40°, without being limited thereto.

The bottom surface 346L of the insulating liner 346 may include a portion in contact with the metal silicide film 152 and a portion in contact with the bottom contact unit BCA3 of the source/drain contact CA3. The bottom contact unit BCA3 of the source/drain contact CA3 may have an inclined outer wall in contact with the inclined bottom surface included in the bottom surface 346L of the insulating liner 346.

The metal silicide film 152 may include a portion in contact with the insulating spacer 120. In some example embodiments, the metal silicide film 152 may be in contact with a pair of insulating spacers 120 and a pair of insulating liners 346, which are adjacent to each other on both sides of the metal silicide film 152. The bottom contact unit BCA3 of the source/drain contact CA3 may be apart from the insulating spacer 120 with the insulating liner 346 therebetween in the first lateral direction (X direction). The source/drain contact CA3 may not include a portion in contact with the insulating spacer 120.

Similar to the IC device 100 described with reference to FIGS. 1 and 2A to 2C, each of the IC devices 200 and 300 described with reference to FIGS. 3 and 4 may include the metal silicide film 152 entirely covering a top surface of a source/drain region SD and a source/drain contact CA2 or CA3 on the metal silicide film 152. In addition, the source/drain contacts CA2 and CA3 may respectively include bottom contact units BCA2 and BCA3, each of which has a contact surface contacting the top surface of the metal silicide film 152 over a relatively great contact area. Thus, even when the IC devices 200 and 300 have device regions with reduced areas due to the downscaling of IC devices, insulation distances between the gate lines GL and the source/drain contacts CA2 and CA3 adjacent thereto may be stably ensured or improved in the IC devices 200 and 300, and contact resistances between the source/drain regions SD and the source/drain contacts CA2 and CA3 may be reduced. Accordingly, the electrical properties and reliability of the IC devices 200 and 300 may be improved.

Figure 5:
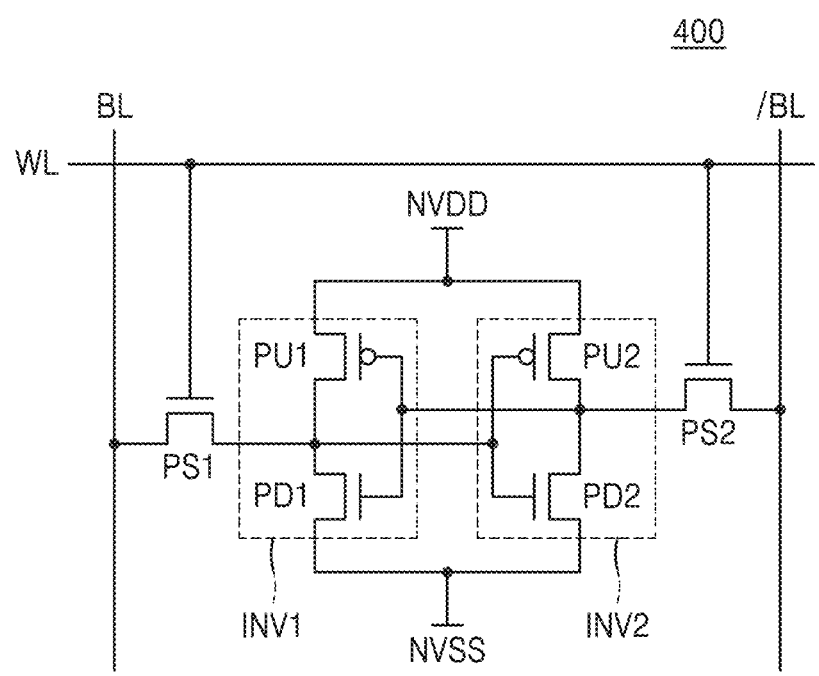
FIG. 5 is a circuit diagram of an IC device according to some example embodiments.

FIG. 5 is a circuit diagram of an IC device 400 according to some example embodiments. A circuit diagram of a 6-transistor static random access memory (ST SRAM) cell including six transistors is illustrated in FIG. 5.

Referring to FIG. 5, the IC device 400 may include a pair of inverters INV1 and INV2, which are connected in parallel between a power node NVDD and a ground node NVSS, and a first pass transistor PS1 and a second pass transistor PS2, which are respectively connected to output nodes of the inverters INV1 and INV2. The first pass transistor PS1 and the second pass transistor PS2 may be respectively connected to a bit line BL and a complementary bit line/BL. A gate of each of the first pass transistor PS1 and the second pass transistor PS2 may be connected to a word line WL.

The first inverter INV1 may include a first pull-up transistor PU1 and a first pull-down transistor PD1, which are connected in series, and the second inverter INV2 may include a second pull-up transistor PU2 and a second pull-down transistor PD2, which are connected in series. Each of the first pull-up transistor PU1 and the second pull-up transistor PU2 may include a PMOS transistor, and each of the first pull-down transistor PD1 and the second pull-down transistor PD2 may include an NMOS transistor.

An input node of the first inverter INV1 may be connected to an output node of the second inverter INV2, and an input node of the second inverter INV2 may be connected to an output node of the first inverter INV1 so that the first inverter INV1 and the second inverter INV2 may constitute one latch circuit.

Figure 6:
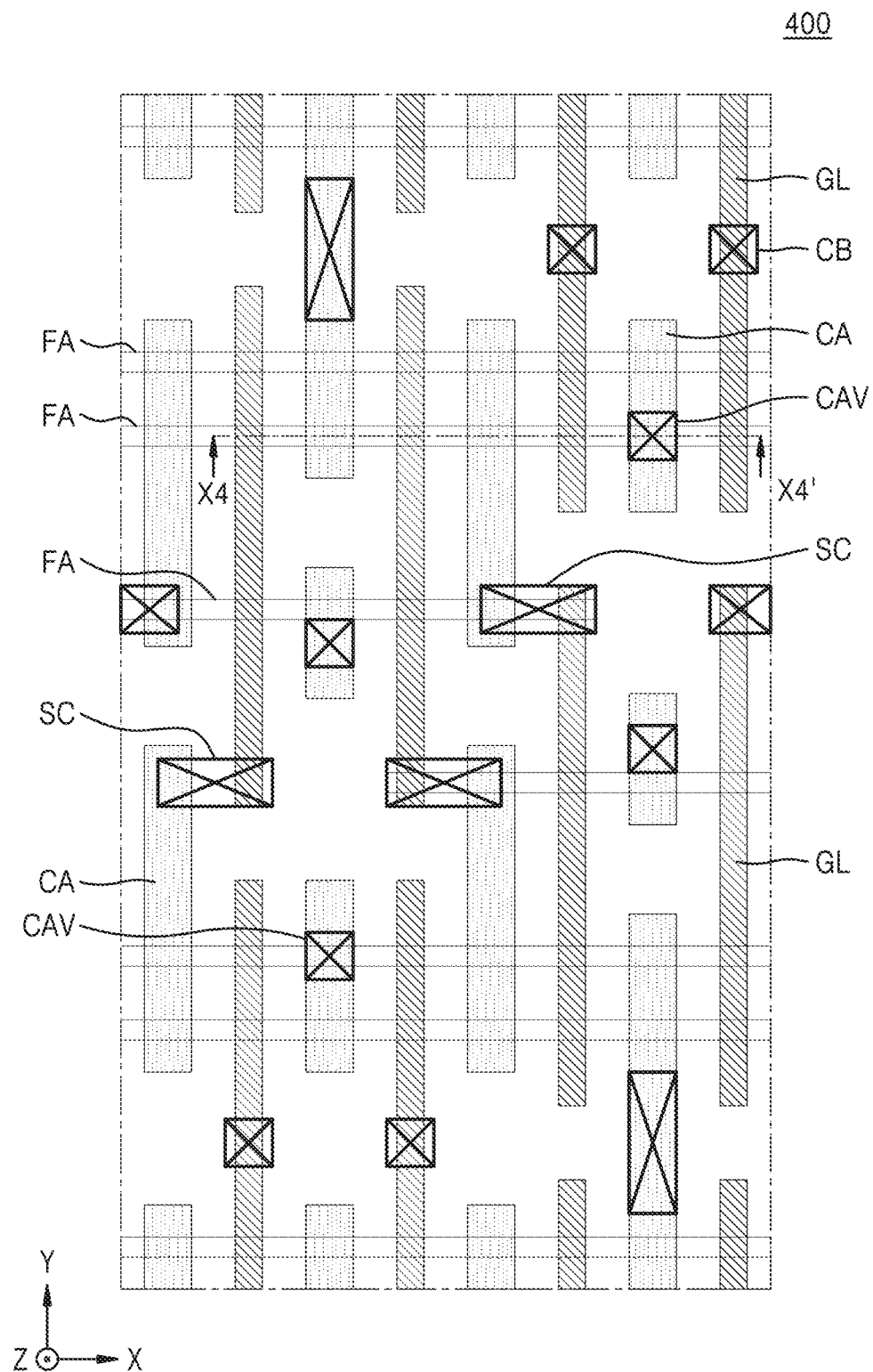
FIG. 6 is a detailed plan layout diagram of the IC device shown in FIG. 5.
Figure 7:
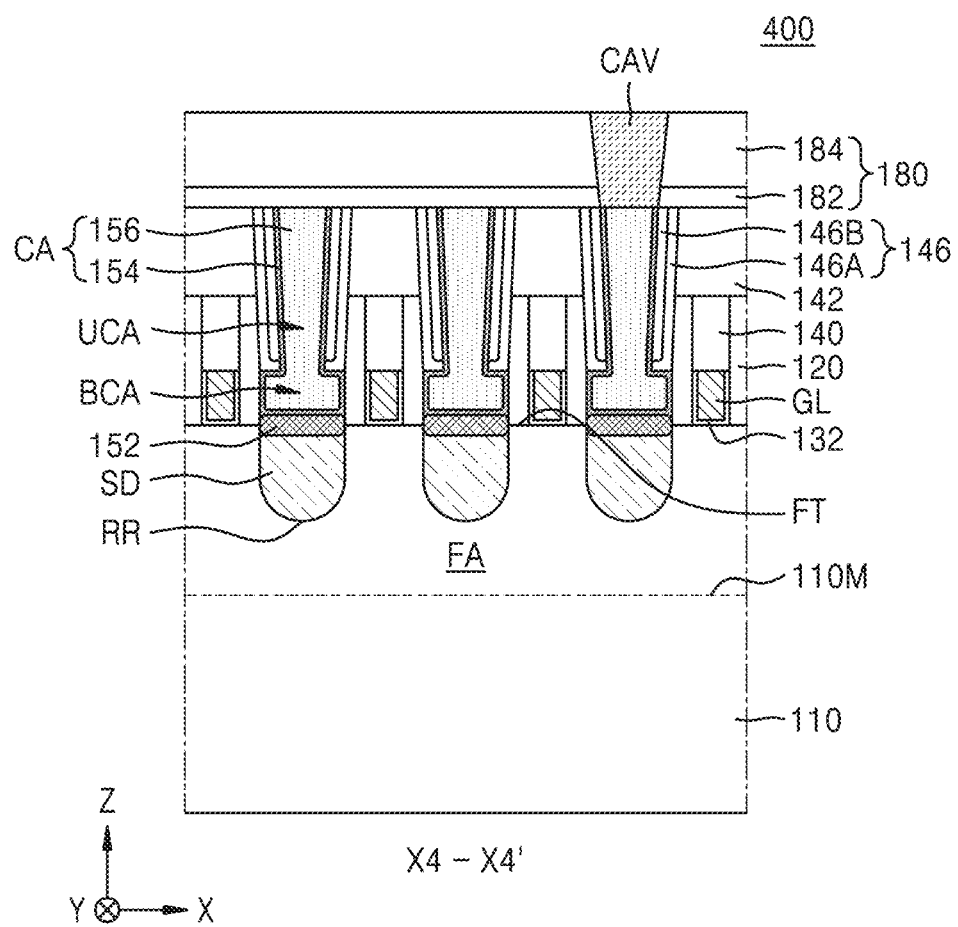
FIG. 7 is a cross-sectional view taken along a line X4-X4' of FIG. 6.

FIG. 6 is a detailed plan layout diagram of the IC device 400 shown in FIG. 5. FIG. 7 is a cross-sectional view taken along a line X4-X4' of FIG. 6. In FIGS. 6 and 7, the same reference numerals are used to denote the same elements as in FIGS. 1 and 2A to 2C, and repeated descriptions thereof are omitted. The IC device 400 shown in FIGS. 6 and 7 may include an SRAM array including a plurality of SRAM cells arranged in a matrix form on the substrate 110. Each of the plurality of SRAM cells may have a circuit configuration shown in FIG. 5.

Referring to FIGS. 6 and 7, the IC device 400 may include a plurality of fin-type active regions FA and a plurality of gate lines GL. The plurality of fin-type active regions FA may extend parallel to each other in a first lateral direction (X direction). The plurality of gate lines GL may extend parallel to each other in a second lateral direction (Y direction) on the plurality of fin-type active regions FA.

A transistor may be formed at each of intersections between the plurality of fin-type active regions FA and the plurality of gate lines GL. Each of the plurality of SRAM cells included in the IC device 400 may include the first pull-up transistor PU1, the first pull-down transistor PD1, the first pass transistor PS1, the second pull-up transistor PU2, the second pull-down transistor PD2, and the second pass transistor PS2, which are shown in FIG. 5. The first pull-up transistor PU1 and the second pull-up transistor PU2 may include PMOS transistors, while the first pull-down transistor PD1, the second pull-down transistor PD2, the first pass transistor PS1, and the second pass transistor PS2 may include NMOS transistors. The IC device 400 may include a plurality of shared contacts SC, each of which connects the gate line GL and the source/drain region SD in common.

As shown in FIG. 7, in the IC device 400, each of the plurality of source/drain regions SD may be covered by the metal silicide film 152, and a source/drain contact CA may be formed on the metal silicide film 152. The source/drain contact CA may be apart from the gate line GL in the first lateral direction (X direction) with the insulating spacer 120 therebetween. The source/drain contact CA may include a bottom contact unit BCA and an upper contact unit UCA. The bottom contact unit BCA may have a contact surface in contact with a top surface of the metal silicide film 152. The upper contact unit UCA may be apart from the metal silicide film 152 with the bottom contact unit BCA therebetween in a vertical direction (Z direction) and integrally connected to the bottom contact unit BCA. In the first lateral direction (X direction), a width of the bottom contact unit BCA may be greater than a width of at least a portion of the upper contact unit UCA. The upper contact unit UCA of the source/drain contact CA may be surrounded by an insulating liner 146. Detailed descriptions of the source/drain contact CA, the insulating liner 146, and the metal silicide film 152 may be the same as those described with reference to FIGS. 2A to 2C.

The IC device 400 shown in FIGS. 6 and 7 may include the metal silicide film 152 entirely covering a top surface of the source/drain region SD and the source/drain contact CA on the metal silicide film 152, and the source/drain contact CA may include the lower unit BCA having a contact surface, which contacts the top surface of the metal silicide film 152 over a relatively great contact area. Thus, even when the IC device 400 has a device region with a reduced area due to the downscaling of IC devices, an insulation distance between the gate line GL and the source/drain contact CA adjacent thereto may be stably ensured or improved in the IC device 400, and a contact resistance between the source/drain region SD and the source/drain contact CA may be reduced. Accordingly, the electrical properties and reliability of the IC device 400 may be improved.

Although FIG. 7 illustrates an example in which the IC device 400 includes the source/drain contact CA and the insulating liner 146, which are shown in FIGS. 2A and 2C, the inventive concepts are not limited thereto. For example, instead of the source/drain contact CA and the insulating liner 146, the IC device 400 may include the source/drain contact CA2 and the insulating liner 246 that are described with reference to FIG. 3, the source/drain contact CA3 and the insulating liner 346 that are described with reference to FIG. 4, or a source/drain contact and an insulating liner that have variously modified and changed structures within the scope of the inventive concept.

Figure 8:
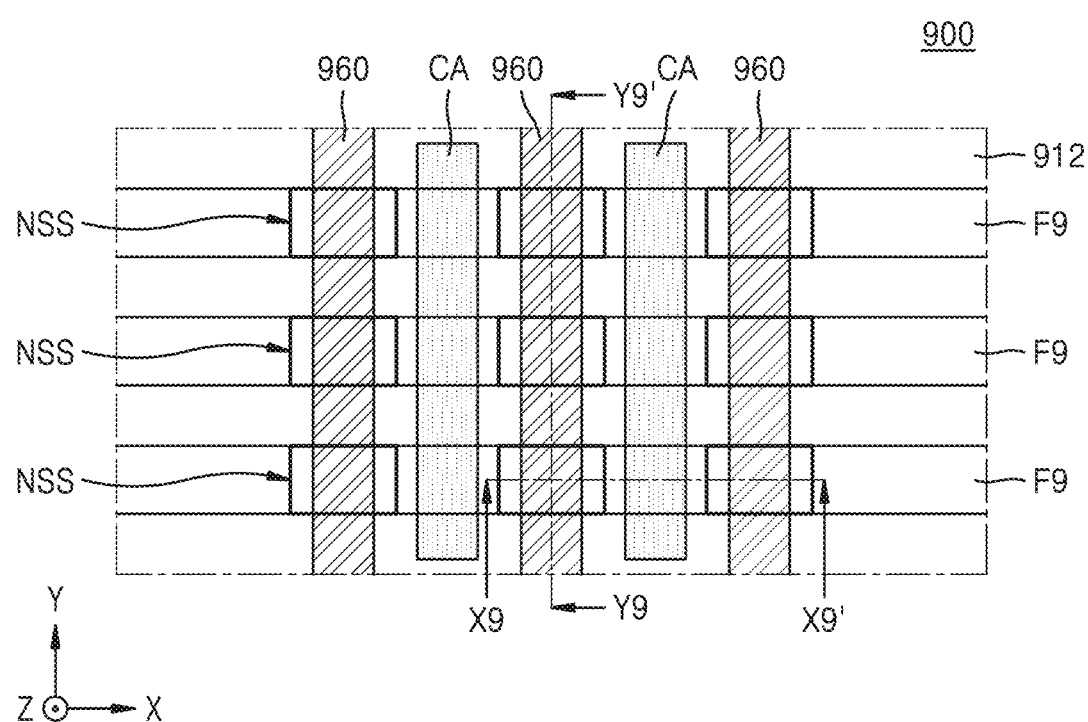
FIG. 8 is a schematic plan layout diagram of some components of an IC device according to some example embodiments.
Figure 9:
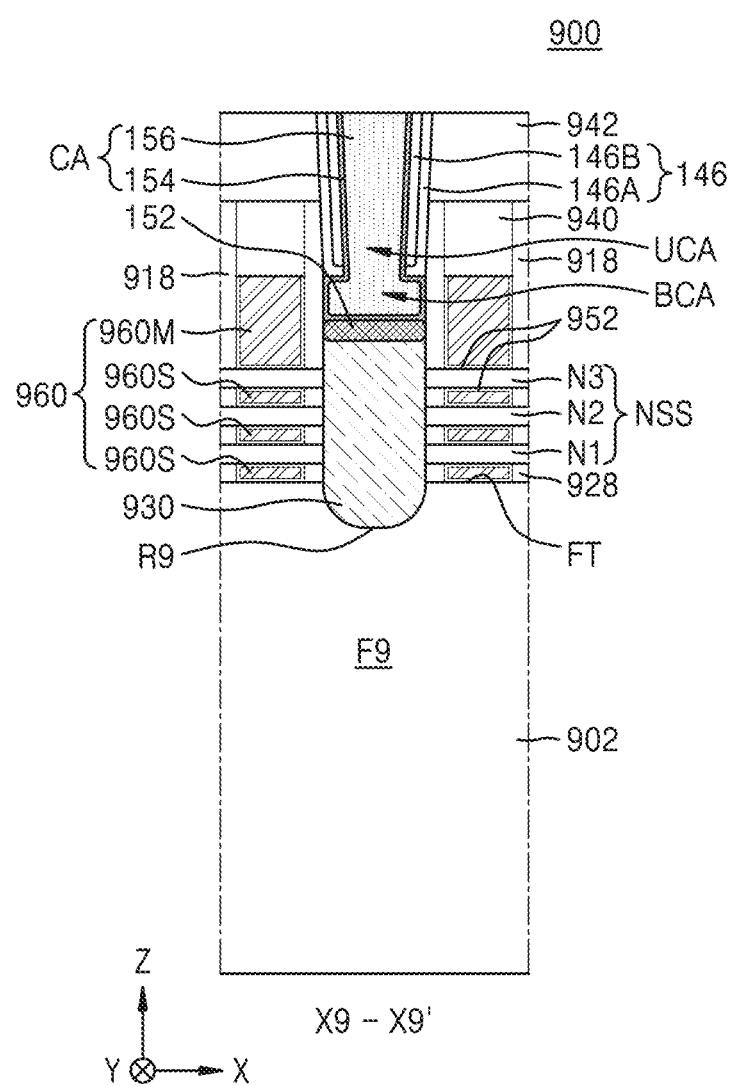
FIG. 9 is a cross-sectional view taken along a line X9-X9' of FIG. 8.

FIG. 8 is a schematic plan layout diagram of some components of an IC device 900 according to some example embodiments. FIG. 9 is a cross-sectional view taken along a line X9-X9' of FIG. 8, and FIG. 10 is a cross-sectional view taken along a line Y9-Y9' of FIG. 8.

Figure 10:
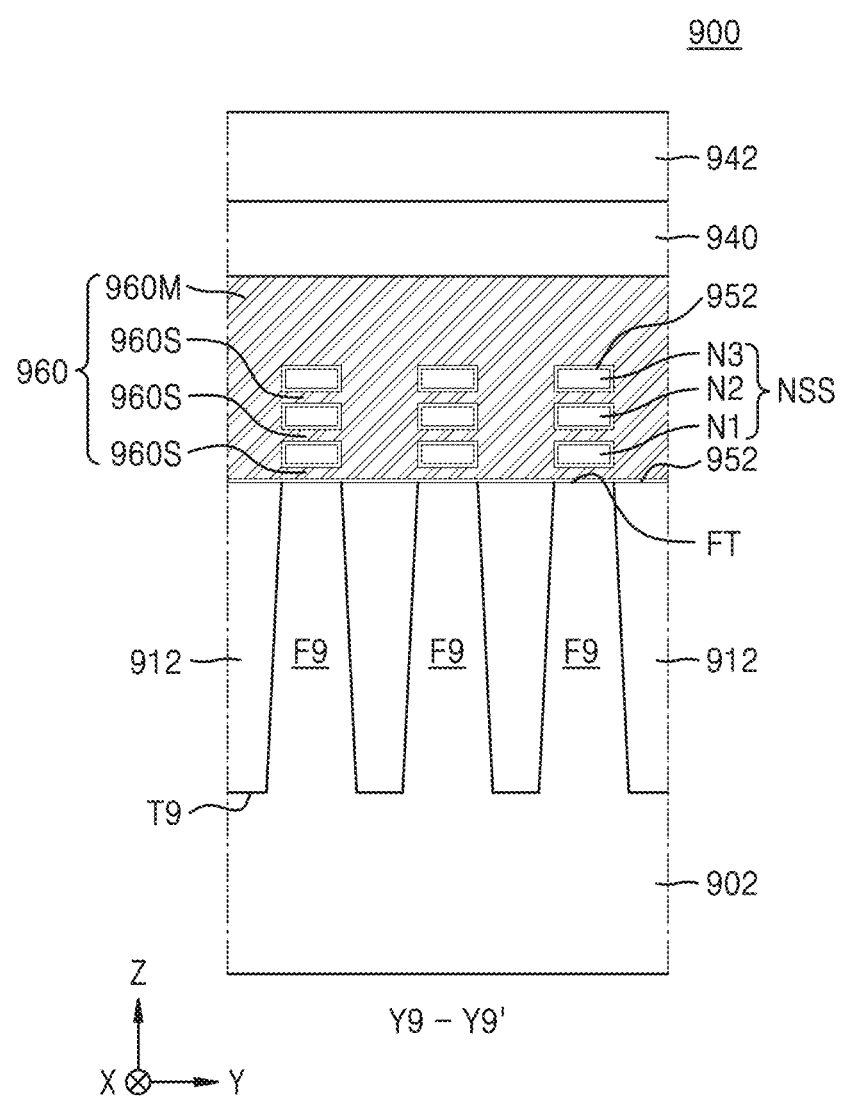
FIG. 10 is a cross-sectional view taken along a line Y9-Y9' of FIG. 8.

Referring to FIGS. 8 to 10, the IC device 900 may include a plurality of fin-type active regions F9 and a plurality of nanosheet stacks NSS. The plurality of fin-type active regions F9 may protrude from a substrate 902 and extend long in a first lateral direction (X direction). The plurality of nanosheet stacks NSS may face fin top surfaces FT of the plurality of fin-type active regions F9 at positions apart from the plurality of fin-type active regions F9) upward in a vertical direction (Z direction). As used herein, the term "nanosheet" refers to a conductive structure having a cross-section substantially perpendicular to a direction in which current flows. The nanosheet may be interpreted as including a nanowire.

Trenches T9 may be formed in the substrate 902 to define the plurality of fin-type active regions F9 and filled with a device isolation film 912. The substrate 902, the plurality of fin-type active regions F9, and the device isolation film 912 may have substantially the same configurations as those of the substrate 110, the fin-type active region FA, and the device isolation film 112, which are described with reference to FIGS. 1 and 2A to 2C.

The plurality of gate lines 960 may extend in a second lateral direction (Y direction) on the plurality of fin-type active regions F9. The plurality of nanosheet stacks NSS may be respectively on the fin top surfaces FT of the plurality of fin-type active regions F9 at intersections between the plurality of fin-type active regions F9 and the plurality of gate lines 960 and face the fin top surfaces FT of the fin-type active regions F9 at positions apart from the fin-type active regions F9. A plurality of nanosheet transistors may be formed at intersections between the plurality of fin-type active regions F9 and the plurality of gate lines 960 on the substrate 902.

Each of the plurality of nanosheet stacks NSS may include a plurality of nanosheets (e.g., first to third nanosheets N1, N2, and N3), which overlap each other in the vertical direction (Z direction) on the fin top surface FT of the fin-type active region F9. The first to third nanosheets N1, N2, and N3 may be at different distances from the fin top surface FT of the fin-type active region F9 in the vertical direction.

Although FIG. 8 illustrates a case in which the nanosheet stack NSS has a substantially rectangular planar shape, the inventive concepts are not limited thereto. The nanosheet stack NSS may have various planar shapes according to a planar shape of each of the fin-type active region F9 and the gate line 960. Some example embodiments as shown in FIG. 8 pertains to a configuration in which the plurality of nanosheet stacks NSS and the plurality of gate lines 960 are formed on one fin-type active region F9, and the plurality of nanosheet stacks NSS are arranged in a line in a first lateral direction (X direction) on one fin-type active region F9. However, according to the inventive concepts, the number of nanosheet stacks NSS on one fin-type active region F9 is not specifically limited. For example, one nanosheet stack NSS may be formed on one fin-type active region F9. Some example embodiments as shown in FIG. 8 pertains to a case in which each of the plurality of nanosheet stacks NSS includes three nanosheets, but the inventive concepts are not limited thereto. For example, the nanosheet stack NSS may include at least two nanosheets, and the number of nanosheets included in the nanosheet stack NSS is not specifically limited.

Each of the first to third nanosheets N1, N2, and N3 may have a channel region. In some example embodiments, each of the first to third nanosheets N1, N2, and N3 may include a silicon layer, a silicon germanium (SiGe) layer, or a combination thereof.

A plurality of recess regions R9 may be formed in upper portions of the fin-type active regions F9, and the plurality of source/drain regions 930 may be in the plurality of recess regions R9. A plurality of source/drain regions 930 may include an epitaxially grown semiconductor layer. A detailed configuration of the plurality of source/drain regions 930 may be substantially the same as that of the source/drain region SD described with reference to FIGS. 2A and 2C.

The gate line 960 may cover the nanosheet stack NSS and surround each of the first to third nanosheets N1, N2, and N3 on the fin-type active region F9. Each of the plurality of gate lines 960 may include a main gate portion 960M and a plurality of sub-gate portions 960S. The main gate portion 960M may cover a top surface of the nanosheet stack NSS and extend long in a second lateral direction (Y direction). The plurality of sub-gate portions 960S may be integrally connected to the main gate portion 960M and respectively arranged one by one between the first to third nanosheets N1, N2, and N3 and between the fin-type active region F9 and the first nanosheet N1. Each of the first to third nanosheets N1, N2, and N3 may have a gate-all-around (GAA) structure surrounded by the gate line 960. A material for the gate line 960 may be substantially the same as a material for the gate line GL, which is described with reference to FIGS. 1 and 2A to 2C. A gate insulating film 952 may be between the nanosheet stack NSS and the gate line 960. The gate insulating film 952 may have substantially the same configuration as the gate insulating film 132 described with reference to FIGS. 2A to 2C. A top surface of the source/drain region 930 may be covered by a metal silicide film 152. The metal silicide film 152 may have substantially the same configuration as the metal silicide film 152 described with reference to FIGS. 2A to 2C.

Both sidewalls of each of the plurality of gate lines 960 may be covered by a plurality of outer insulating spacers 918. The plurality of outer insulating spacers 918 may cover both sidewalls of the main gate portion 960M on the plurality of nanosheet stacks NSS.

A plurality of inner insulating spacers 928 may be between the first to third nanosheets N1, N2, and N3 and between the fin-type active region F9 and the first nanosheet N1. Both sidewalls of each of the plurality of sub-gate portions 960S may be covered by the inner insulating spacers 928 with the gate insulating film 952 therebetween. The plurality of inner insulating spacers 928 may be between the plurality of sub-gate portions 960S and the source/drain regions 930. In some example embodiments, the outer insulating spacers 918 and the inner insulating spacers 928 may include the same insulating material. In other example embodiments, the outer insulating spacers 918 may include a different insulating material from the inner insulating spacers 928. The inner insulating spacers 928 may include silicon nitride (SiN), silicon carbonitride (SiCN), silicon boron nitride (SiBN), silicon oxynitride (SiON), silicon oxycarbonitride (SiOCN), silicon boron carbonitride (SiBCN), silicon oxycarbide (SiOC), silicon dioxide ($SiO_2$), or a combination thereof. The inner insulating spacers 928 may further include air gaps. In some example embodiments, when the nanosheet stack NSS and the gate line 960 surrounding the nanosheet stack NSS constitute a PMOS transistor, the inner insulating spacers 928 may be omitted. In this case, the gate insulating film 952 covering the plurality of sub-gate portions 960S may be in direct contact with the source/drain region 930.

As shown in FIG. 9, in the IC device 900, each of the plurality of source/drain regions 930 may be covered by the metal silicide film 152, and a source/drain contact CA may be formed on the metal silicide film 152. The source/drain contact CA may be apart from the gate line 960 with the outer insulating spacers 918 therebetween in a first lateral direction (X direction). The source/drain contact CA may include a bottom contact unit BCA and an upper contact unit UCA. The bottom contact unit BCA may have a contact surface in contact with a top surface of the metal silicide film 152. The upper contact unit UCA may be apart from the metal silicide film 152 with the bottom contact unit BCA therebetween in a vertical direction (Z direction) and integrally connected to the bottom contact unit BCA. In the first lateral direction (X direction), a width of the bottom contact unit BCA may be greater than a width of at least a portion of the upper contact unit UCA. The upper contact unit UCA of the source/drain contact CA may be surrounded by an insulating liner 146. Detailed configurations of the source/drain contact CA, the insulating liner 146, and the metal silicide film 152 may be the same as those described with reference to FIGS. 2A to 2C.

The plurality of gate lines 960 may be respectively covered by a plurality of insulating capping lines 940. A top surface of each of the plurality of the insulating capping lines 940 and the plurality of outer insulating spacers 918 may be covered by an upper insulating film 942. The source/drain contact CA and the insulating liner 146 may pass through the upper insulating film 942 in the vertical direction (Z direction) and be in contact with the metal silicide film 152. The insulating capping line 940 and the upper insulating film 942 may have substantially the same configurations as the insulating capping line 140 and the upper insulating film 142 described with reference to FIGS. 2A to 2C The IC device 900 described with reference to FIGS. 8 to 19 may include the metal silicide film 152 entirely covering a top surface of the source/drain region 930 and the source/drain contact CA on the metal silicide film 152, and the source/drain contact CA may include the bottom contact unit BCA having the contact surface, which contacts the top surface of the metal silicide film 152 over a relatively great contact area. Thus, even when the IC device 900 has a device region with a reduced area due to the downscaling of IC devices, an insulation distance between the gate line 960 and the source/drain contact CA adjacent thereto may be stably ensured or improved in the IC device 900, and a contact resistance between the source/drain region 930 and the source/drain contact CA may be reduced. Accordingly, the electrical properties and reliability of the IC device 900 may be improved.

Although FIG. 9 illustrates an example in which the IC device 900 includes the source/drain contact CA and the insulating liner 146, which are shown in FIGS. 2A and 2C, the inventive concepts are not limited thereto. For example, instead of the source/drain contact CA and the insulating liner 146, the IC device 900 may include the source/drain contact CA2 and the insulating liner 246, which are described with reference to FIG. 3, the source/drain contact CA3 and the insulating liner 346, which are described with reference to FIG. 4, or a source/drain contact and an insulating liner having variously modified and changed structures within the scope of the inventive concept.

Hereinafter, a method of manufacturing an IC device according to some example embodiments will be described in detail.

FIGS. 11A to 11J are cross-sectional views of a process sequence of a method of manufacturing an IC device 100, according to some example embodiments. FIGS. 11A to 11J are cross-sectional views of a sequence of processes on partial regions of regions corresponding to the cross-section taken along the line X2-X2' of FIG. 2A. An example method of manufacturing the IC device 100 shown in FIGS. 1 and 2A to 2C will be described with reference to FIGS. 11A to 11J. Although FIGS. 11A to 11J illustrate a sequence of processes on a partial region of a second device region RX2, substantially the same processes as described below may be performed on a first device region RX1. In FIGS. 11A to 11J, the same reference numerals are used to denote the same elements as in FIGS. 2A to 2C, and repeated descriptions thereof are omitted.

Figure 11A:
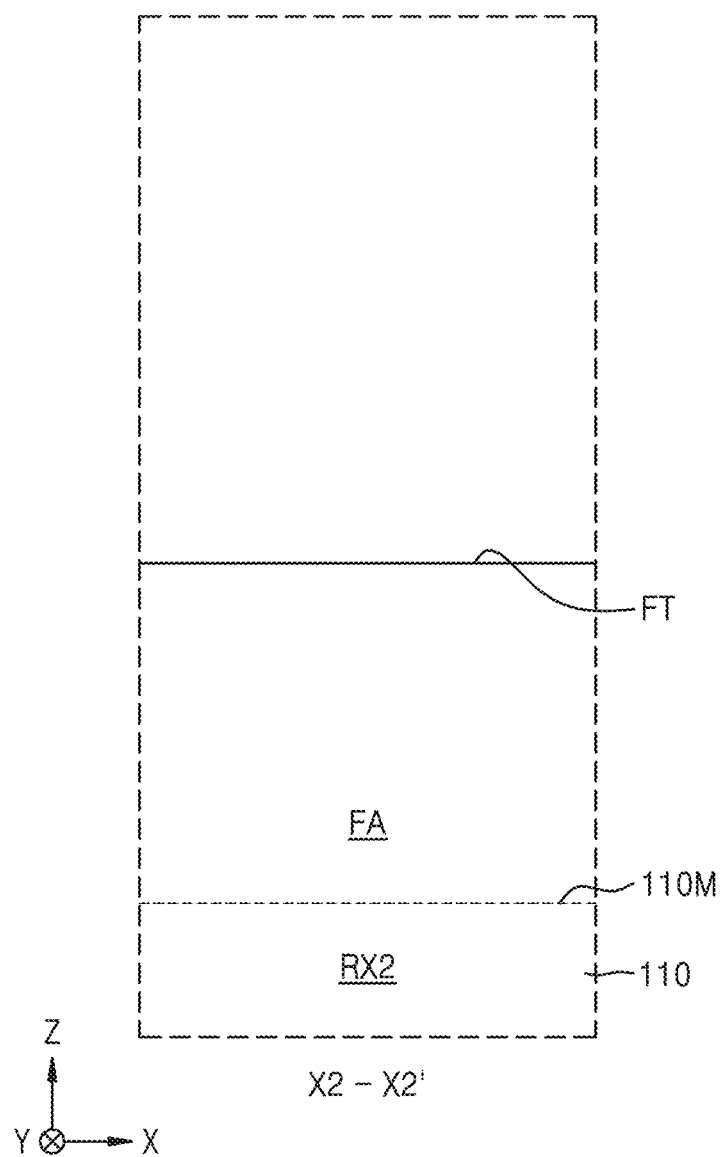
FIGS. 11A to 11J are cross-sectional views of a process sequence of a method of manufacturing an IC device, according to some example embodiments.

Referring to FIG. 11A, portions of a substrate 110 may be etched in first and second device regions (refer to RX1 and RX2 in FIGS. 1 and 2A) to form a plurality of fin-type active regions FA, which protrude upward from a main surface 110M of the substrate 110 in a vertical direction (Z direction) and extend parallel to each other in a first lateral direction (X direction), and a device isolation film (refer to 112 in FIG. 2B) may be formed to cover both lower sidewalls of each of the plurality of fin-type active regions FA. Thereafter, a portion of the device isolation film 112 and a portion of the substrate 110 may be etched to form a deep trench (refer to DT in FIG. 2B) defining the first device region RX1 and the second device region RX2, and the deep trench DT may be filled with a device isolation insulating film (refer to 114 FIG. 2B). Accordingly, as shown in FIG. 2B, the deep trench DT may be filled with the device isolation insulating film 114 in a device isolation region DTA, and the plurality of fin-type active regions FA may protrude over a top surface of the device isolation film 112 in the first device region RX1 and the second device region RX2

Figure 11B:
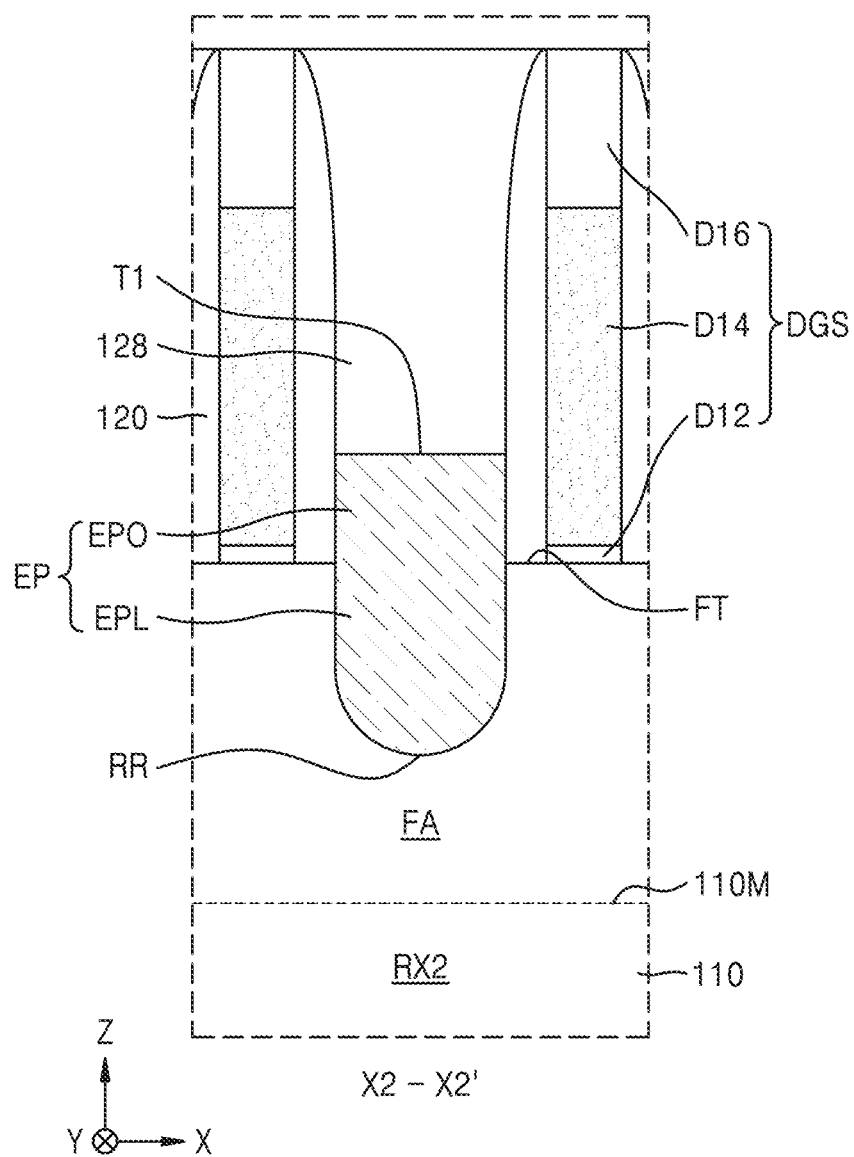

Referring to FIG. 11B, a plurality of dummy gate structures DGS may be formed to extend on the device isolation film 112 and the device isolation insulating film 114 and intersect with the plurality of fin-type active regions FA. Each of the plurality of dummy gate structures DGS may include a dummy gate insulating film D12, a dummy gate line D14, and a dummy insulating capping layer D16, which are sequentially stacked on fin top surfaces FT of the plurality of fin-type active regions FA and each of the device isolation film 112 and the device isolation insulating film 114. The dummy gate insulating film D12 may include a silicon oxide film. The dummy gate line D14 may include a polysilicon film. The dummy insulating capping layer D16 may include a silicon nitride film.

The insulating spacers 120 may be formed on both sidewalls of the dummy gate structure DGS, and portions of the plurality of fin-type active regions FA exposed between the dummy gate structures DGS may be etched, and thus, a plurality of recess regions RR may be formed in the plurality of fin-type active regions FA.

Thereafter, a plurality of epitaxial films EP may be formed in the first device region RX1 and the second device region RX2 to fill the plurality of recess regions RR. Each of the plurality of epitaxial films EP may include a lower epitaxial portion EPL and an overgrowth portion EPO. The lower epitaxial portion EPL may fill the recess region RR at a level equal to or lower than a level of the fin top surface FT of the fin-type active region FA. The overgrowth portion EPO may protrude in the vertical direction (Z direction) from the lower epitaxial portion EPL to a level higher than the level of the fin top surface FT of the fin-type active region FA. The overgrowth portion EPO of the epitaxial film EP may have an upper facet T1. In some example embodiments, the upper facet Ti may have a {100} plane orientation. The upper facet Ti may extend in a direction parallel to the main surface 110M of the substrate 110 at a level higher than the level of the fin top surface FT of the fin-type active region FA. In a subsequent process, at least a portion of the lower epitaxial portion EPL may remain as a source/drain region (refer to SD in FIG. 2A).

In some example embodiments, the epitaxial film EP in the first device region RX1 may include a Si layer doped with an n-type dopant, and the epitaxial film EP in the second device region RX2 may include a SiGe layer doped with a p-type dopant. To form the epitaxial film EP, a low-pressure CVD (LPCVD) process, a selective epitaxial growth (SEG) process, or a cyclic deposition and etching (CDE) process may be performed using source materials including element semiconductor precursors. In some example embodiments, to form the epitaxial film EP including a silicon layer doped with an n-type dopant, silane ($SiH_4$), disilane ($Si_2H_6$), trisilane ($Si_3H_8$), or dichlorosilane ($SiH_2Cl_2$) may be used as a silicon source. The n-type dopant may be selected from phosphorus, arsenic, and antimony. In other example embodiments, to form the epitaxial film EP including a SiGe layer doped with a p-type dopant, a Si source and a Ge source may be used. Silane ($SiH_4$), disilane ($Si_2H_6$), trisilane ($Si_3H_8$), and/or dichlorosilane ($SiH_2Cl_2$) may be used as the Si source. Germane ($GeH_4$), digermane ($Ge_2H_6$), trigermane ($Ge_3H_8$), tetragermane ($Ge_4H_{10}$), and/or dichlorogermane ($Ge_2H_2Cl_2$) may be used as the Ge source. The p-type dopant may be selected from boron and gallium.

A process of forming the epitaxial film EP in the first device region RX1 and a process of forming the epitaxial film EP in the second device region RX2 may be sequentially performed. For example, after the epitaxial film EP is formed in the first device region RX1, the epitaxial film EP may be formed in the second device region RX2. Alternatively, after the epitaxial film EP is formed in the second device region RX2, the epitaxial film EP may be formed in the first device region RX1.

After the epitaxial film EP is formed in each of the first device region RX1 and the second device region RX2, an inter-gate dielectric film 128 may be formed between a plurality of dummy gate structures DGS to cover the epitaxial film EP. The inter-gate dielectric film 128 may be formed to cover the device isolation film 112 and the device isolation insulating film 114, which are shown in FIG. 2B. The inter-gate dielectric film 128 may be formed to have a planarized top surface. After the inter-gate dielectric film 128 is formed, a top surface of the dummy insulating capping layer D16 may be exposed.

Figure 11C:
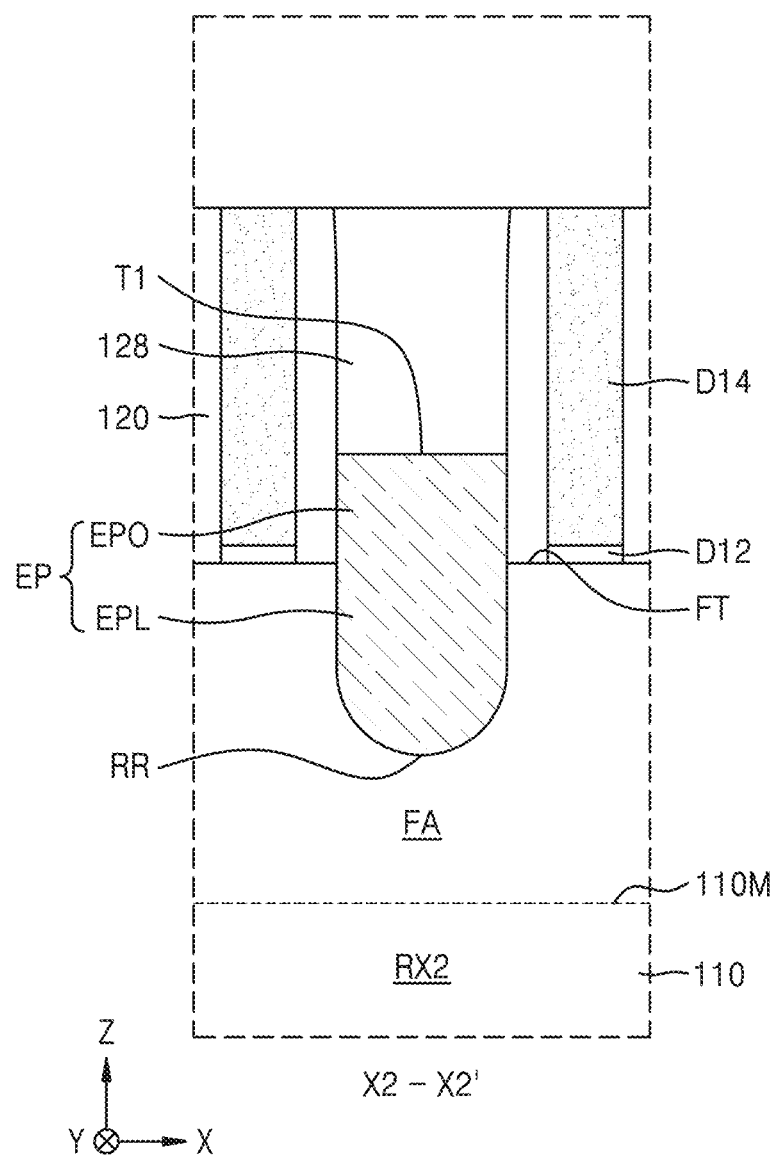

Referring to FIG. 11C, in the resultant structure of FIG. 11B, the dummy insulating capping layer D16 and insulating films adjacent thereto may be removed using a chemical mechanical polishing (CMP) process to expose a top surface of the dummy gate line D14. As a result, heights of the inter-gate dielectric film 128 and the plurality of insulating spacers 120 may be reduced.

Figure 11D:
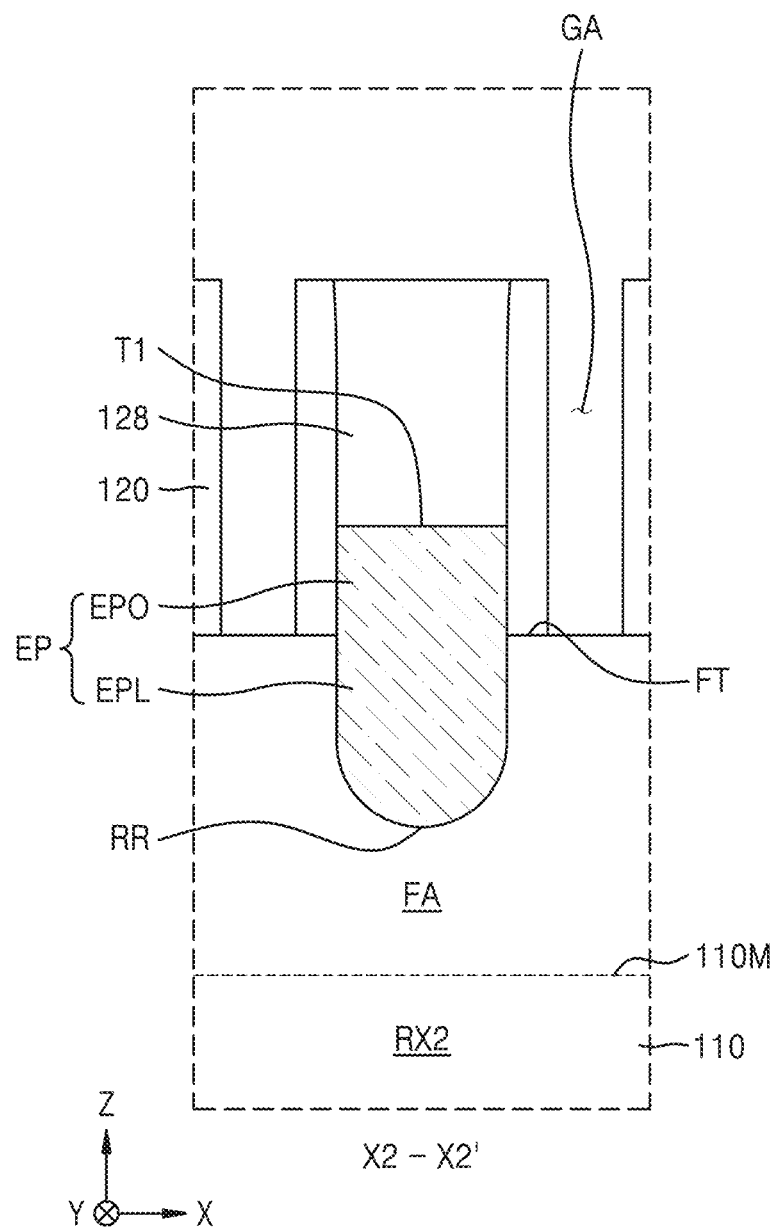

Referring to FIG. 11D, a plurality of dummy gate lines D14 and a plurality of dummy gate insulating films D12 may be removed from the resultant structure of FIG. 11C, and thus, a plurality of gate spaces GA may be provided. The insulating spacer 120, the plurality of fin-type active regions FA, the device isolation film 112, and the device isolation insulating film (refer to 114 in FIG. 2B) may be exposed through the plurality of gate spaces GA.

Figure 11E:
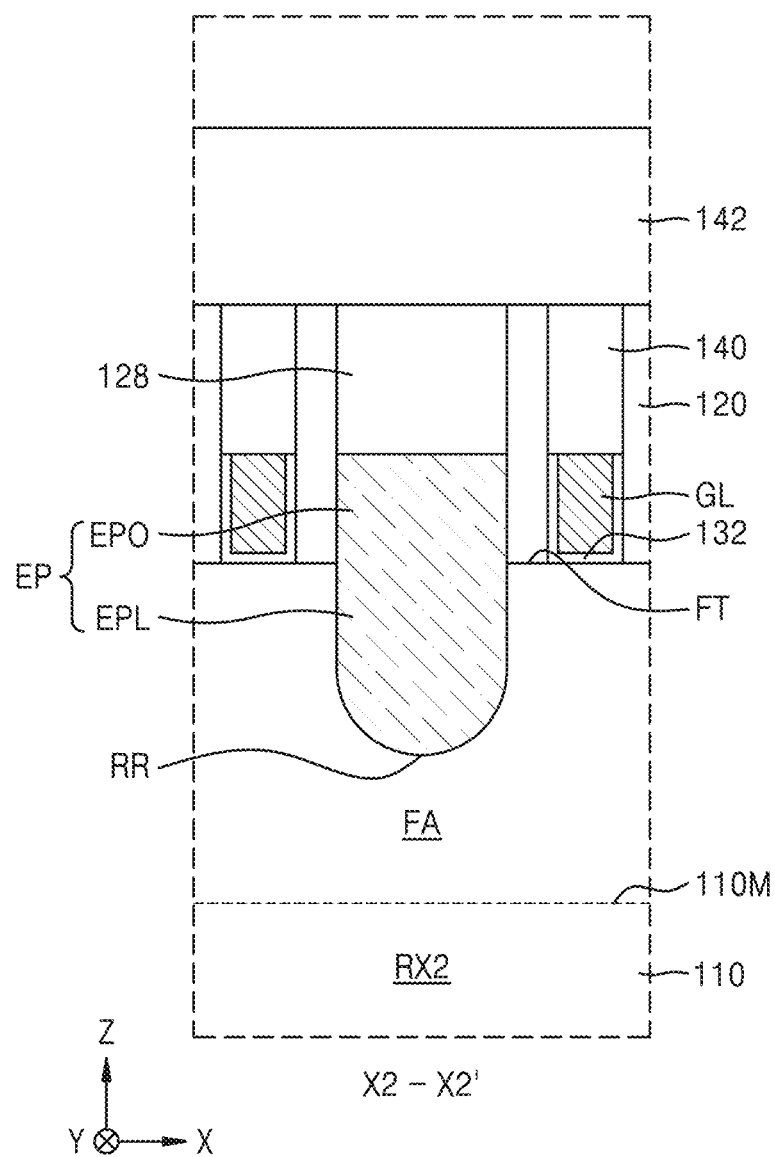

Referring to FIG. 11E, in the resultant structure of FIG. 11D, a gate insulating film 132, a gate line GL, and an insulating capping line 140 may be formed inside each of the plurality of gate spaces GA.

To form the gate insulating film 132, the gate line GL, and the insulating capping line 140, to begin, a plurality of gate insulating films 132 and a plurality of gate lines GL may be formed to fill the plurality of gate spaces GA. Thereafter, the plurality of gate insulating films 132 and the plurality of gate lines GL may be etched back to fill only lower portions of the gate spaces GA, respectively. During the etching-back of the gate insulating films 132 and the gate lines GL, an upper portion of each of the insulating spacers 120 and the inter-gate dielectric film 128 may be removed together, and thus, a height of each of the insulating spacers 120 and the inter-gate dielectric film 128 may be reduced. Thereafter, the insulating capping line 140 may be formed to cover a top surface of the gate line GL and the gate insulating film 132 in each of the plurality of gate spaces GA and fill an upper portion of the gate space GA. The insulating capping line 140 may be formed to have a planarized top surface. During the planarization of the top surface of the insulating capping line 140, the upper portion of each of the insulating spacer 120 and the inter-gate dielectric film 128 may be removed together, and thus, the height of each of the insulating spacer 120 and the inter-gate dielectric film 128 may be further reduced.

Thereafter, an upper insulating film 142 may be formed to cover the top surface of each of the insulating capping line 140 and the inter-gate dielectric film 128.

In some example embodiments, before the gate insulating films 132 are formed, an interface film (not shown) may be formed to cover a surface of each of the plurality of fin-type active regions FA, which are exposed through the plurality of gate spaces GA. To form the interface film, portions of the plurality of fin-type active regions FA, which are exposed in the plurality of gate spaces GA, may be oxidized.

Figure 11F:
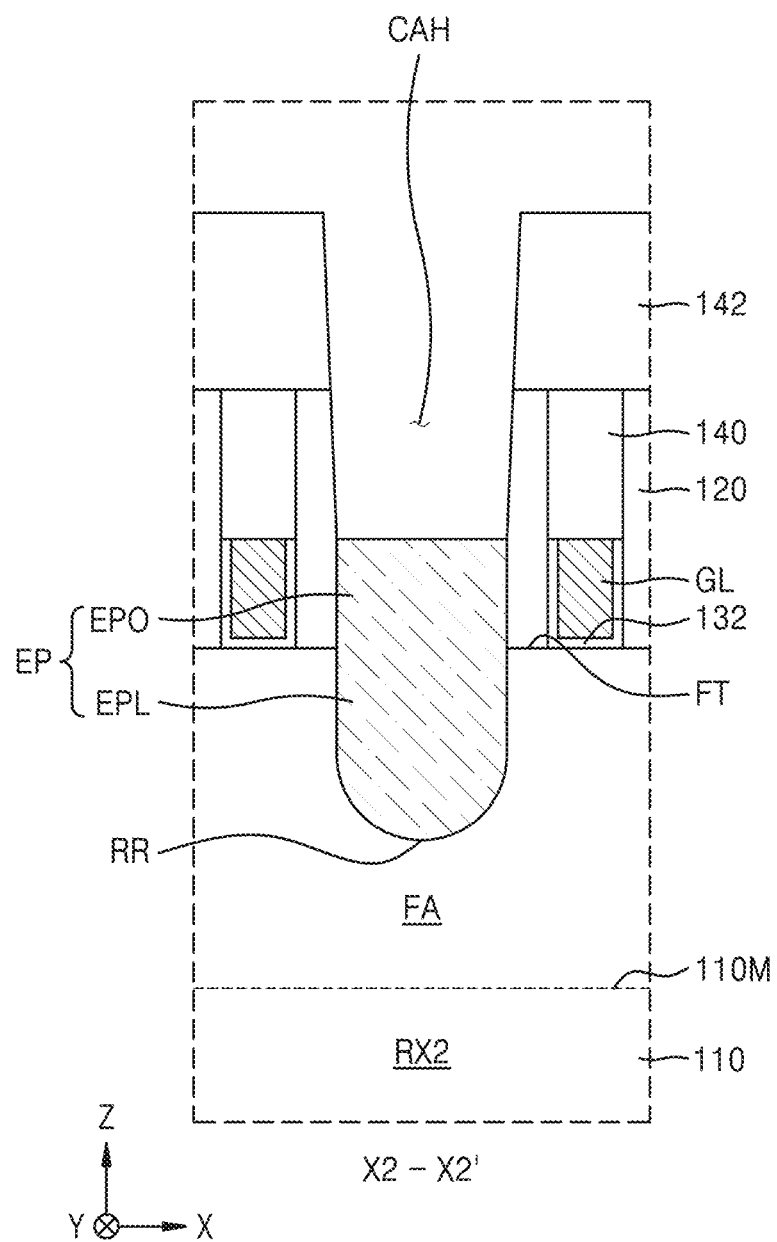

Referring to FIG. 11F, in the resultant structure of FIG. 11E, a source/drain contact hole CAH may be formed to pass through the upper insulating film 142 and the inter-gate dielectric film 128 and expose the overgrowth portion EPO of the epitaxial film EP.

Figure 11G:
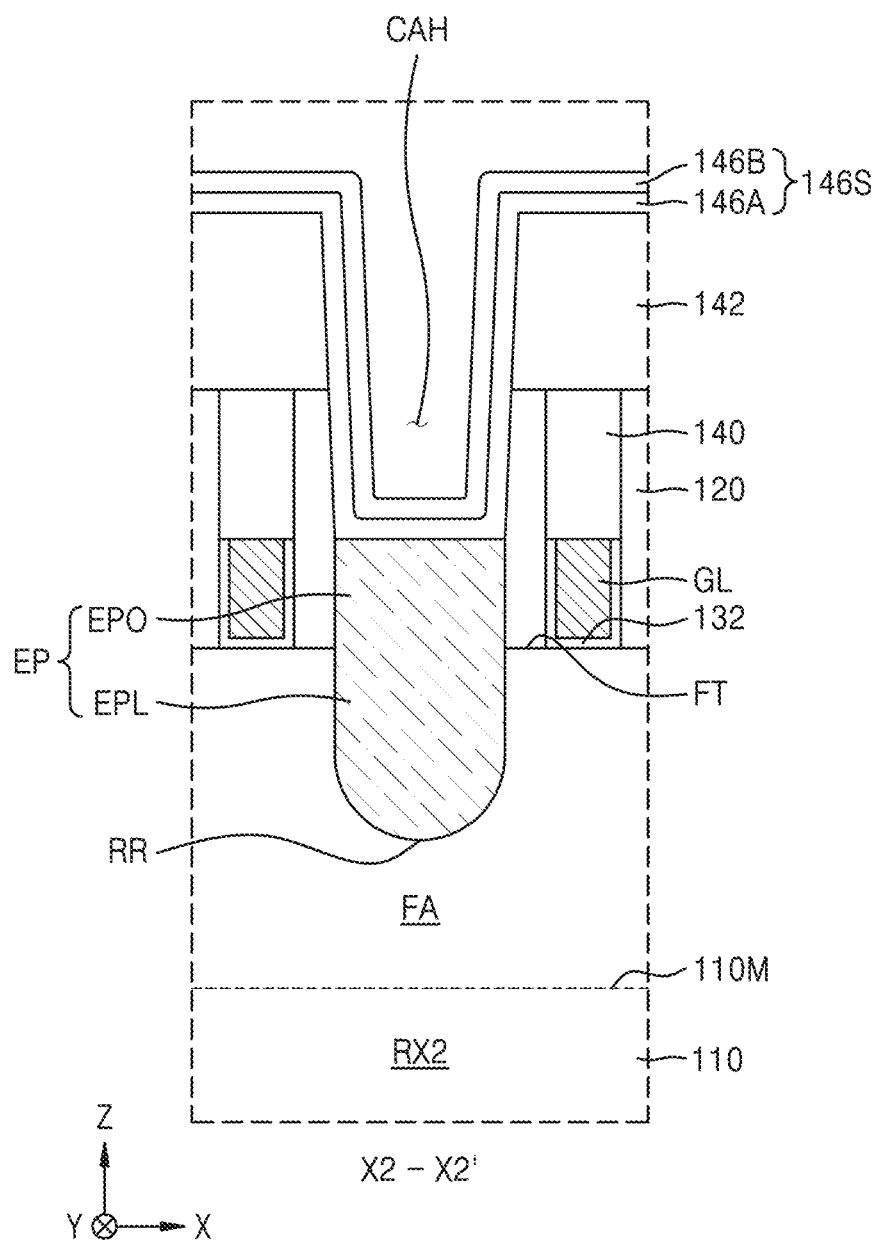

Referring to FIG. 11G, in the resultant structure of FIG. 11F, an insulating liner structure 146S may be formed to conformally cover an inner wall of the source/drain contact hole CAH. The insulating liner structure 146S may include a silicon nitride film, a silicon oxide film, or a combination thereof. Some example embodiments illustrated in FIG. 11G pertains to an example in which the insulating liner structure 146S includes a first insulating liner 146A and a second first insulating liner 146B, which sequentially cover sidewalls of the insulating spacers 120.

Each of the first insulating liner 146A and the second first insulating liner 146B may be formed using an atomic layer deposition (ALD) process or a plasma-enhanced chemical vapor deposition (PECVD) process. In some example embodiments, the first insulating liner 146A and the second first insulating liner 146B may include silicon nitride films having respectively different densities. For example, one of the first insulating liner 146A and the second first insulating liner 146B may be formed using an ALD process, and the other one of the first insulating liner 146A and the second first insulating liner 146B may be formed using a PECVD process, but the inventive concepts are not limited thereto.

Figure 11H:
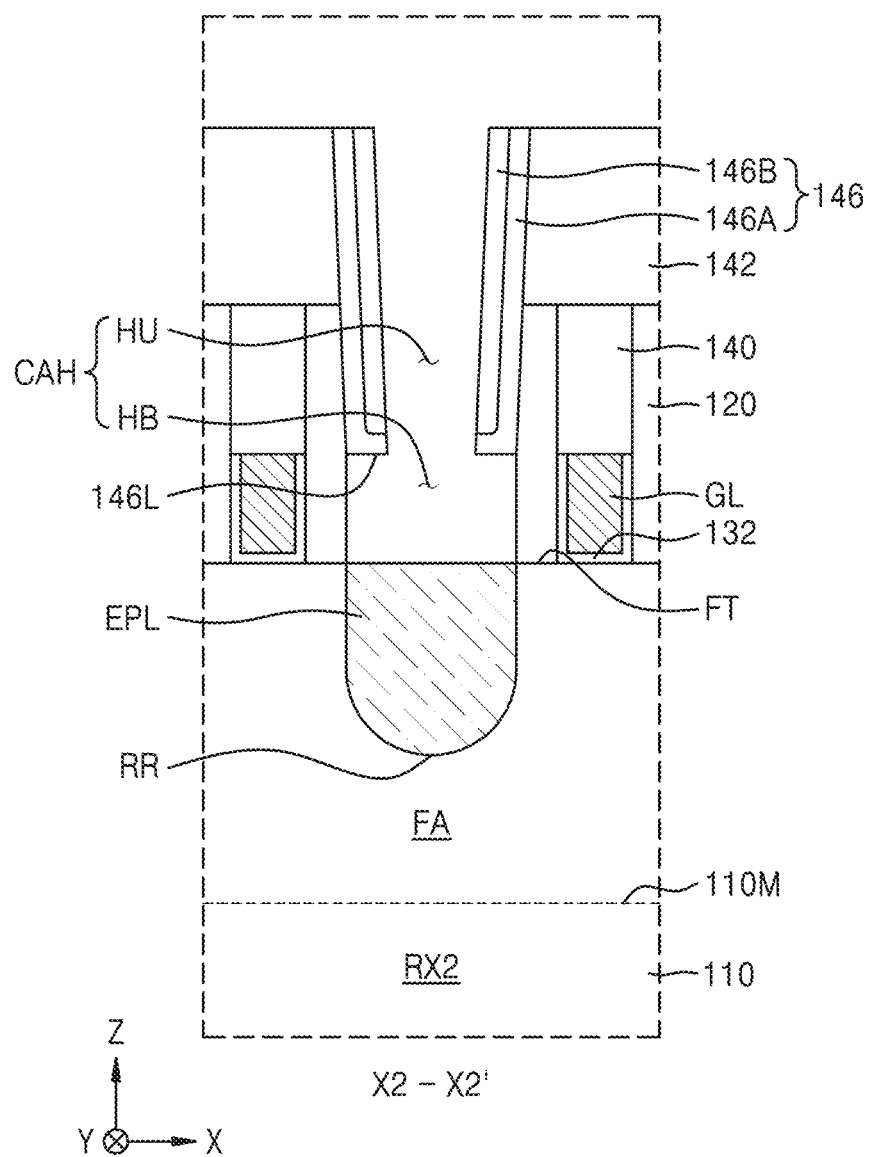

Referring to FIG. 11H, the insulating liner structure 146S may be anisotropically etched in the resultant structure of FIG. 11G, and thus, an insulating liner 146 may be formed from the insulating liner structure 146S.

After the insulating liner 146 is formed, a top surface of the upper insulating film 142 may be exposed outside the source/drain contact hole CAH. In addition, after the insulating liner 146 is formed, the epitaxial film EP may be exposed inside the source/drain contact hole CAH. After the epitaxial film EP is exposed inside the source/drain contact hole CAH, the overgrowth portion EPO of the epitaxial film EP that is exposed may be continuously anisotropically etched such that the source/drain contact hole CAH extends further lengthily toward the substrate 110. As a result, a length of the source/drain contact hole CAH in the vertical direction (Z direction) may be increased, and the overgrowth portion EPO of the epitaxial film EP may be removed.

In some example embodiments, the anisotropic etching of the insulating liner structure 146S and the anisotropic etching of the overgrowth portion EPO of the epitaxial film EP may be performed in the same etching atmosphere. In other example embodiments, the anisotropic etching of the insulating liner structure 146S and the anisotropic etching of the overgrowth portion EPO of the epitaxial film EP may be performed in different etching atmospheres. For example, the anisotropic etching of the insulating liner structure 146S may be performed in an etching atmosphere in which an etch selectivity with respect to a material included in the insulating liner structure 146S is higher than an etch selectivity with respect to a material included in other films adjacent to the insulating liner structure 146S. In addition, the anisotropic etching of the overgrowth portion EPO of the epitaxial film EP may be performed in an etching atmosphere in which an etch selectivity with respect to a material included in the epitaxial film EP is higher than an etch selectivity with respect to a material included in other films adjacent to the epitaxial film EP.

The anisotropic etching of the insulating liner structure 146S and the anisotropic etching of the overgrowth portion EPO of the epitaxial film EP may be each performed using plasma. In this case, etchant ions included in the anisotropic etching atmosphere may move straight in the vertical direction (Z direction) from an entrance portion of the source/drain contact hole CAH to a bottom portion of the source/drain contact hole CAH. The etchant ions, which have moved straight in the vertical direction (Z direction) to the bottom portion of the source/drain contact hole CAH, may physically collide with the bottom portion of the source/drain contact hole CAH and be then reflected in any radial direction from the collision point. Accordingly, ion flux moving in various radial directions may increase in the bottom portion of the source/drain contact hole CAH and regions adjacent thereto. As a result, 3D etching effects may be obtained in the bottom portion of the source/drain contact hole CAH and the regions adjacent thereto. Thus, in the bottom portion of the source/drain contact hole CAH and regions adjacent thereto, the overgrowth portion EPO of the epitaxial film EP may be etched not only in the vertical direction but also in the lateral direction, and only the lower epitaxial portion EPL of the epitaxial film EP may be left inside the recess region RR on the fin-type active region FA.

After the insulating liner 146 is formed and the overgrowth portion EPO of the epitaxial film EP is removed as described above, the source/drain contact hole CAH may include an upper hole portion HU and a bottom hole portion HB. The upper hole portion HU may be defined by the insulating liner 146, and the bottom hole portion HB may be connected to the upper hole portion HU and is at a lower portion relatively close to the substrate 110. The bottom hole portion HB may have a width greater than a width of the upper hole portion HU in lateral directions (X direction and Y direction). For example, in the first lateral direction (X direction), a width of the bottom hole portion HB may be greater than a width of the upper hole portion HU.

After the overgrowth portion EPO of the epitaxial film EP is removed, the sidewall of the insulating spacer 120, a bottom surface 146L of the insulating liner 146, and the lower epitaxial portion EPL may be exposed at the bottom hole portion HB of the source/drain contact hole CAH.

Figure 11I:
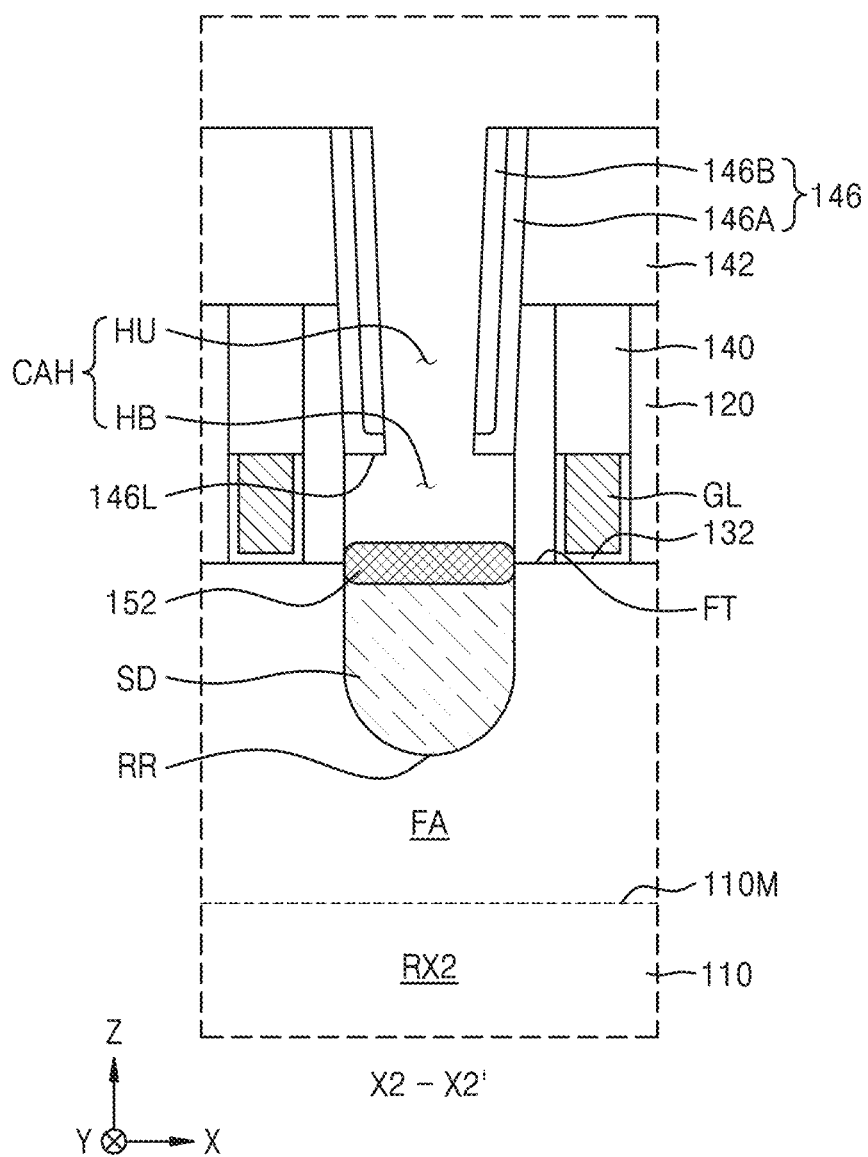

Referring to FIG. 11I, in the resultant structure of FIG. 11H, a metal silicide film 152 may be formed on the lower epitaxial portion EPL, which is exposed through the bottom hole portion HB of the source/drain contact hole CAH.

In some example embodiments, the formation of the metal silicide film 152 may include forming a metal liner (not shown) to conformally cover an inner wall of the source/drain contact hole CAH and performing an annealing process to cause a reaction of the lower epitaxial portion EPL with a metal included in the metal liner. After the metal silicide film 152 is formed, the remaining portion of the metal liner may be removed. During the formation of the metal silicide film 152, a portion of the lower epitaxial portion EPL may be consumed. The remaining portion of the lower epitaxial portion EPL, which is not consumed during the formation of the metal silicide film 152, may be used as the source/drain region SD.

In some example embodiments, the metal liner may include titanium (Ti), and the metal silicide film 152 may include a titanium silicide film, without being limited thereto.

In some example embodiments, a width of the metal silicide film 152 in the first lateral direction (X direction) may be substantially equal to a width of a lowest portion of the bottom hole portion HB in the first lateral direction (X direction). After the metal silicide film 152 is formed, a portion of the metal silicide film 152 may be at a lower level than the fin top surface FT of the fin-type active region FA, and another portion of the metal silicide film 152 may be at a higher level than the fin top surface FT of the fin-type active region FA. A width of the metal silicide film 152 in the first lateral direction (X direction) may be defined by a pair of insulating spacers 120 adjacent to the metal silicide film 152 on both sides of the metal silicide film 152.

Figure 11J:
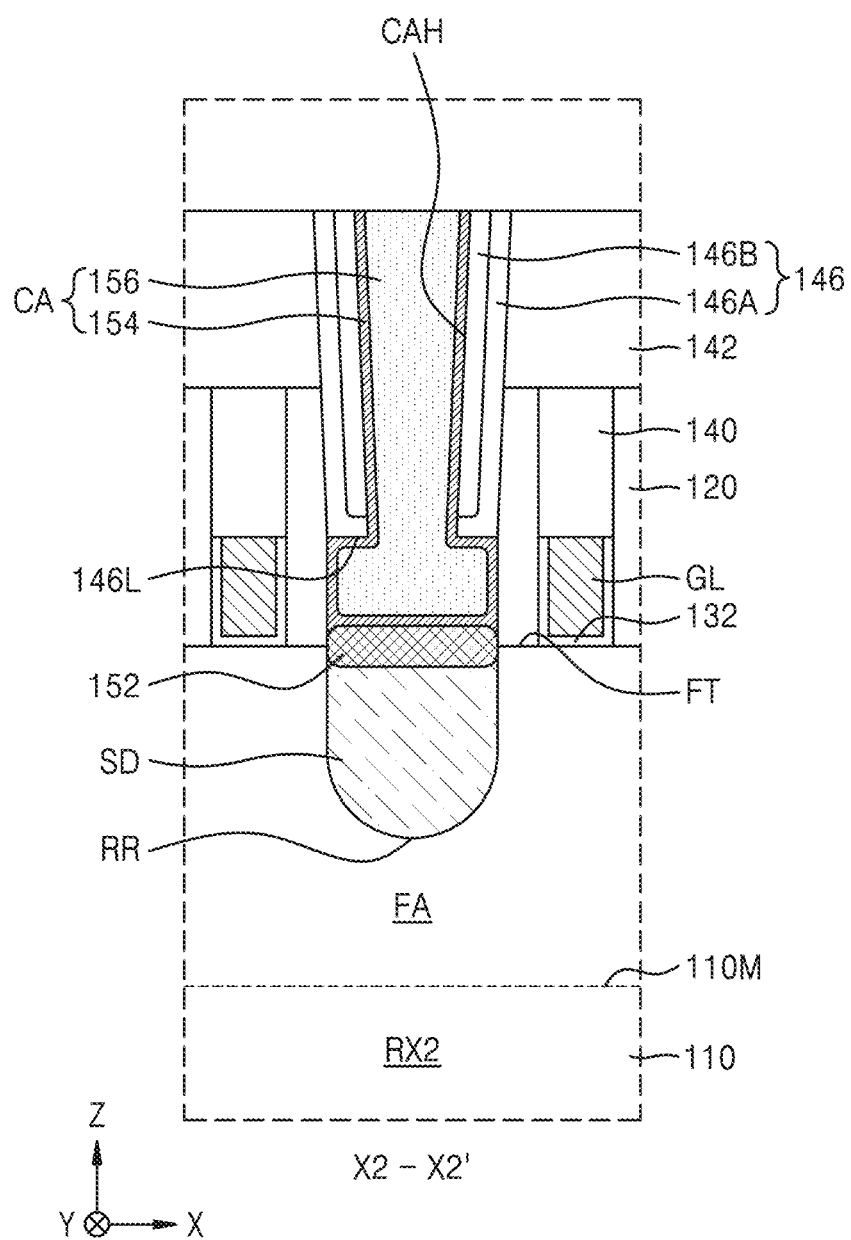

Referring to FIG. 11J, a source/drain contact CA may be formed to fill the bottom hole portion HB and the upper hole portion HU of the source/drain contact hole CAH.

The source/drain contact CA may be formed to include a conductive barrier film 154 and a metal plug 156. The conductive barrier film 154 may conformally cover a top surface of the metal silicide film 152, the sidewall of the insulating spacer 120, the bottom surface 146L and a sidewall of the insulating liner 146. The metal plug 156 may fill the source/drain contact hole CAH on the conductive barrier film 154. Each of the conductive barrier film 154 and the metal plug 156 may be formed using a CVD process, a physical vapor deposition (PVD) process, or an electroplating process. After the conductive barrier film 154 and the metal plug 156 are formed, a top surface of each of the conductive barrier film 154 and the metal plug 156 may be planarized to expose a top surface of the insulating liner 146 and a top surface of the inter-gate dielectric film 128.

Afterwards, as shown in FIGS. 2A and 2B, an etch stop film 182 and an interlayer insulating film 184 may be sequentially formed on the resultant structure of FIG. 11J to form an insulating structure 180. A plurality of source/drain via contacts CAV may be respectively formed to be connected to a plurality of source/drain contacts CA, and a plurality of gate contacts CB may be formed to be connected to the plurality of gate lines GL. Thus, the IC device 100 described with reference to FIGS. 1 and 2A to 2C may be manufactured.

In some example embodiments, the plurality of source/drain via contacts CAV and the plurality of gate contacts CB may be formed simultaneously. In other example embodiments, the plurality of source/drain via contacts CAV and the plurality of gate contacts CB may be sequentially formed using separate processes. In this case, forming the plurality of source/drain via contacts CAV may be followed by forming the plurality of gate contacts CB. Alternatively, forming the plurality of gate contacts CB may be followed by forming the plurality of source/drain via contacts CAV.

Each of the plurality of source/drain via contacts CAV may be formed to pass through the interlayer insulating film 184 and the etch stop film 182 and come into contact with a top surface of the source/drain contact CA. The plurality of gate contacts CB may be formed to pass through the interlayer insulating film 184, the etch stop film 182, the upper insulating film 142, and the insulating capping line 140 and come into contact with a top surface of the gate line GL.

FIGS. 12A to 12E are cross-sectional views of a process sequence of a method of manufacturing an IC device, according to some example embodiments. FIGS. 12A to 12E are cross-sectional views of a sequence of processes on partial regions of regions corresponding to the cross-section taken along the line X2-X2' of FIG. 2A. An example method of manufacturing the IC device 200 shown in FIG. 3 will be described with reference to FIGS. 12A to 12E. Although FIGS. 12A to 12E illustrate a sequence of processes on a partial region of a second device region RX2, substantially the same processes as described below may be performed on a first device region RX1. In FIGS. 12A to 12E, the same reference numerals are used to denote the same elements as in FIGS. 1 to 3 and 11A to 11J, and repeated descriptions thereof are omitted.

Figure 12A:
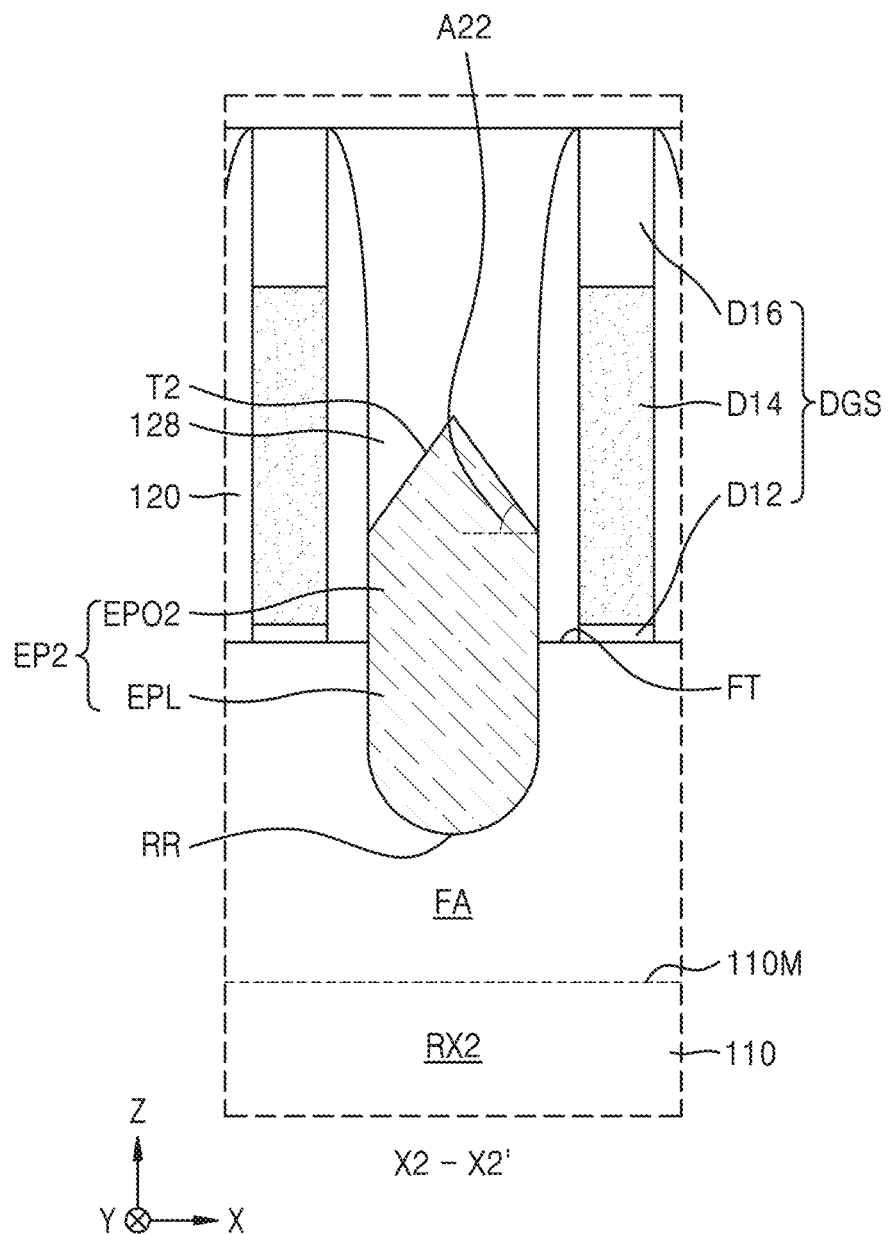
FIGS. 12A to 12E are cross-sectional views of a process sequence of a method of manufacturing an IC device, according to some example embodiments.

Referring to FIG. 12A, a plurality of fin-type active regions FA, a device isolation film 112, and a device isolation insulating film 114 may be formed on a substrate 110 by using the same method as that described with reference to FIG. 11A. A plurality of dummy gate structures DGS and a plurality of insulating spacers 120 may be formed using the same method as that described with reference to FIG. 11B, and a recess region RR may be formed in each of the plurality of fin-type active regions FA.

Thereafter, an epitaxial film EP2 may be formed in the first device region RX1 and the second device region RX2 to fill the recess region RR. The epitaxial film EP2 may include a lower epitaxial portion EPL and an overgrowth portion EPO2, which protrudes from the lower epitaxial portion EPL to a level higher than a level of a fin top surface FT of the fin-type active region FA in a vertical direction (Z direction).

The overgrowth portion EPO2 of the epitaxial film EP2 may have an upper facet T2. The upper facet T2 may be formed to extend in an inclined direction, which intersects with a direction in which the main surface 110M of the substrate 110 extends, at a level higher than the level of the fin top surface FT of the fin-type active region FA. In some example embodiments, an angle A22 between the upper facet T2 and a horizontal line parallel to the main surface 110M of the substrate 110 may be in a range of about 30° to about 40°, without being limited thereto. For example, the upper facet T2 may have a {111} plane orientation. A detailed configuration of the epitaxial film EP2 may be substantially the same as that of the epitaxial film EP, which is described with reference to FIG. 11B.

After the epitaxial film EP2 is formed in each of the first device region RX1 and the second device region RX2, an inter-gate dielectric film 128 may be formed between the plurality of dummy gate structures DGS to cover the epitaxial film EP2. After the inter-gate dielectric film 128 is formed, a top surface of a dummy insulating capping layer D16 may be exposed.

Figure 12B:
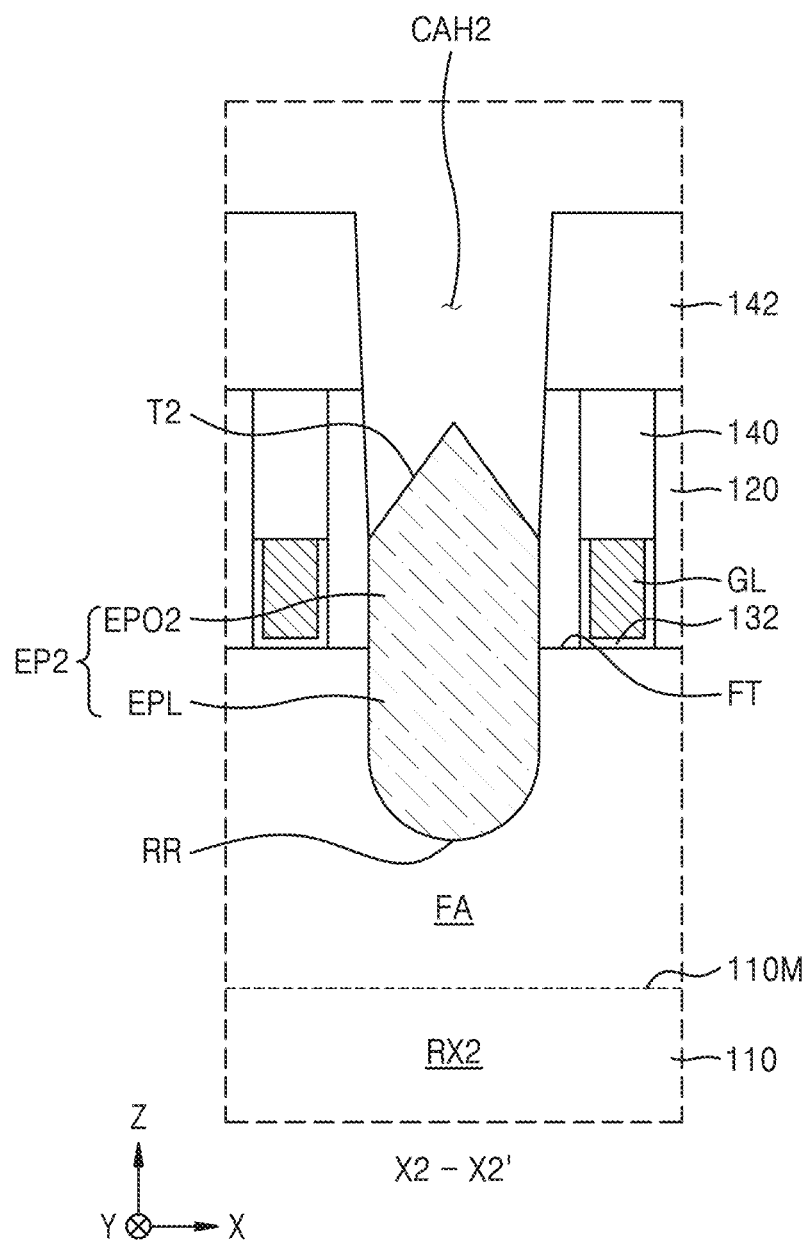

Referring to FIG. 12B, in the resultant structure of FIG. 12A, a gate insulating film 132, a gate line GL, and an insulating capping line 140 may be formed on the substrate 110 by using substantially the same method as that described with reference to FIGS. 11C to 11F. An upper insulating film 142 may be formed to cover a top surface of the insulating capping line 140 and the inter-gate dielectric film 128. Thereafter, a source/drain contact hole CAH2 may be formed to pass through the upper insulating film 142 and the inter-gate dielectric film 128 and expose the overgrowth portion EPO2 of the epitaxial film EP2.

Figure 12C:
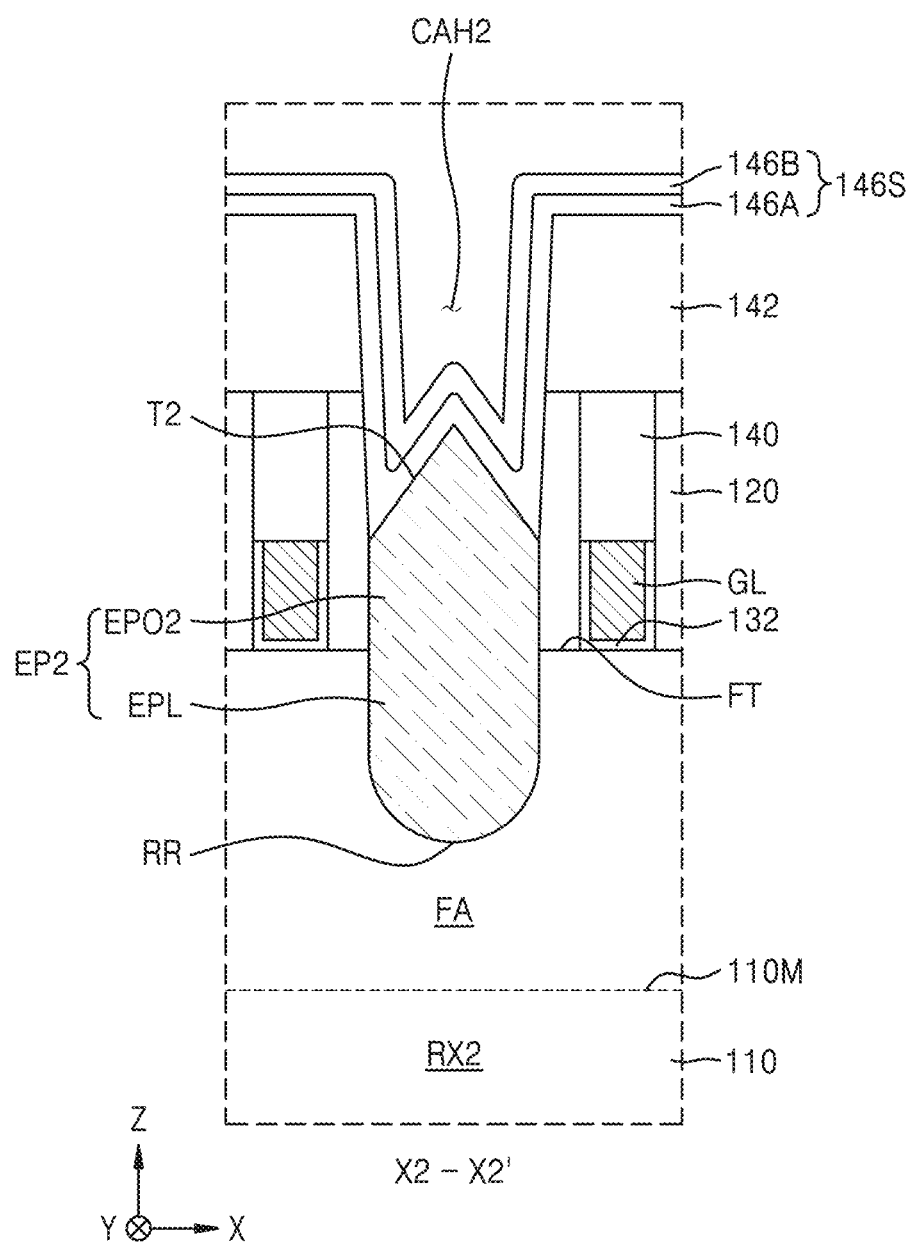

Referring to FIG. 12C, an insulating liner structure 146S may be formed inside the source/drain contact hole CAH2 in the resultant structure of FIG. 12B, by using substantially the same method as that described with reference to FIG. 11G.

Figure 12D:
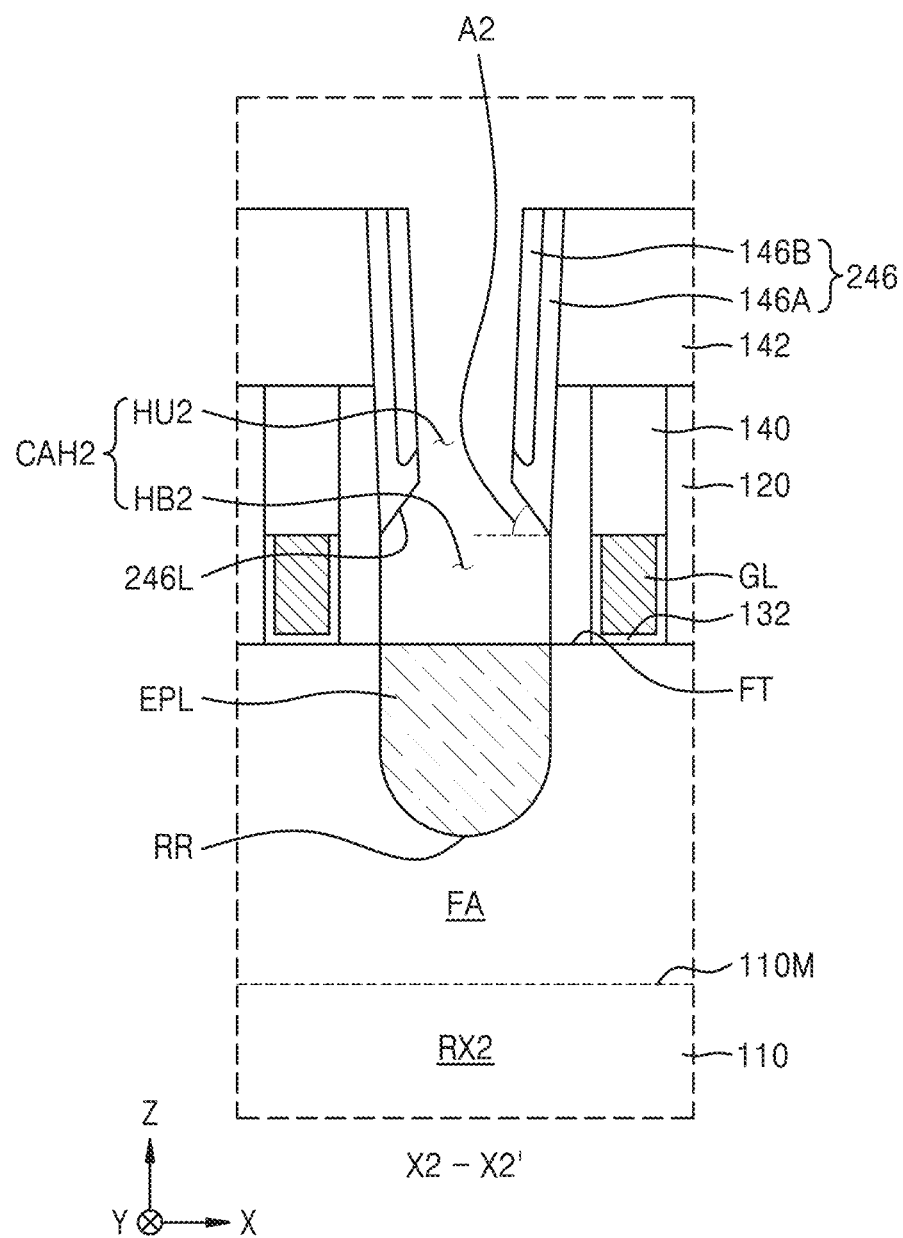

Referring to FIG. 12D, by using substantially the same method as that described with reference to FIG. 11H, the insulating liner structure 146S may be anisotropically etched in the resultant structure of FIG. 12C. Thus, an insulating liner 146 may be formed from the insulating liner structure 146S to expose the epitaxial film EP2. The overgrowth portion EPO2 of the epitaxial film EP2 that is exposed may be continuously etched using an anisotropic etching process and thus removed. As a result, the source/drain contact hole CAH2 may expand and include an upper hole portion HU2 and a bottom hole portion HB2. The upper hole portion HU2 may be defined by an insulating liner 246. The bottom hole portion HB2 may be connected to the upper hole portion HU2 and be at a lower portion relatively close to the substrate 110.

After the overgrowth portion EPO2 of the epitaxial film EP2 is removed, a sidewall of the insulating spacer 120, a bottom surface 246L of the insulating liner 246, and the lower epitaxial portion EPL may be exposed at the bottom hole portion HB2 of the source/drain contact hole CAH2. The bottom surface 246L of the insulating liner 246 may include an inclined bottom surface that extends in an inclined direction, which intersects with a first lateral direction (X direction) at a position apart from the metal silicide film 152 in the vertical direction (Z direction). An angle A2 between the inclined bottom surface included in the bottom surface 246L of the insulating liner 246 and a horizontal line parallel to the main surface 110M of the substrate 110 may be in a range of about 30° to about 40°, without being limited thereto.

Figure 12E:
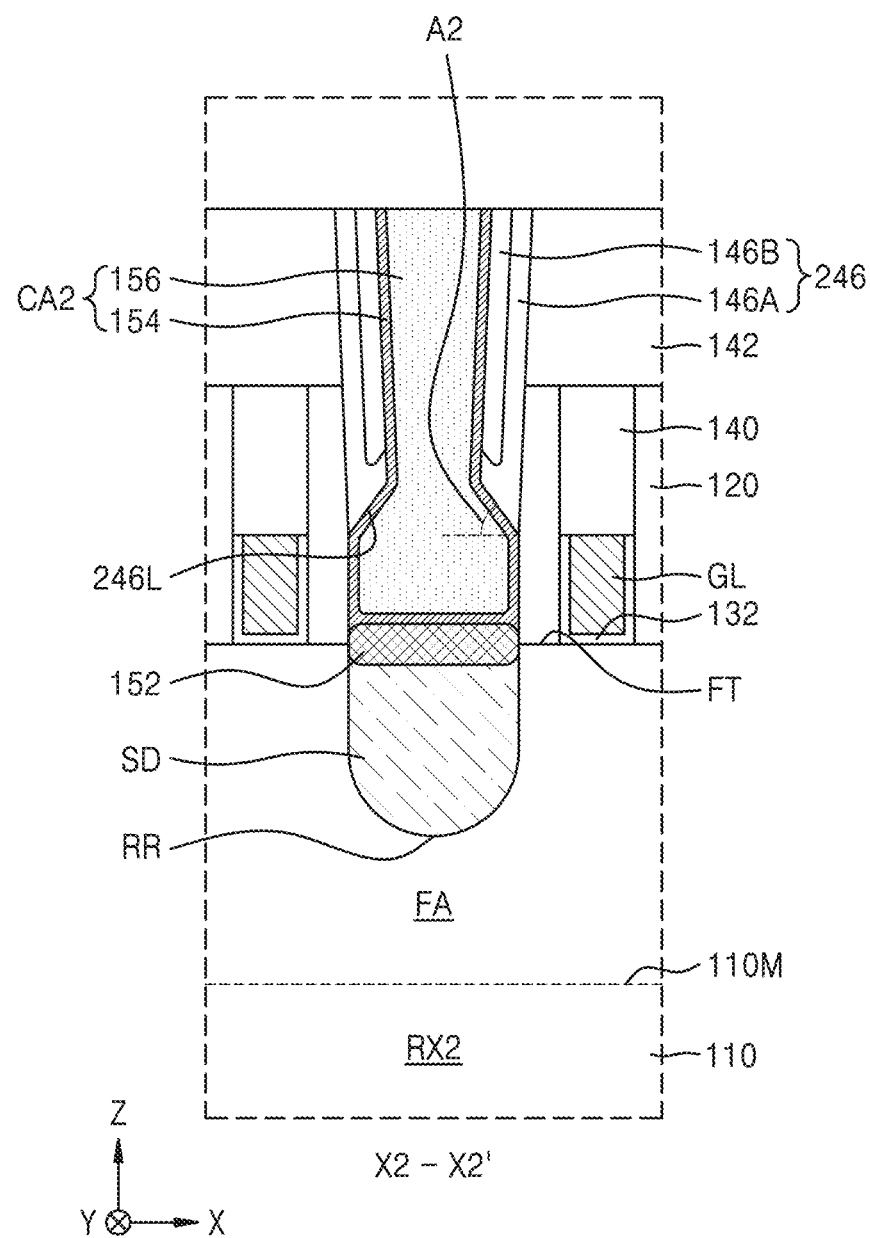

Referring to FIG. 12E, in the resultant structure of FIG. 12D, the metal silicide film 152 may be formed on the lower epitaxial portion EPL by using substantially the same method as that described with reference to FIG. 11I. A source/drain contact CA2 may be formed to fill the bottom hole portion HB2 and the upper hole portion HU2 of the source/drain contact hole CAH2 by using substantially the same method as that described with reference to FIG. 11J. Afterwards, subsequent processes described with reference to FIG. 11J may be performed, and thus, the IC device 200 described with reference to FIG. 3 may be manufactured.

FIGS. 13A to 13E are cross-sectional views of a process sequence of a method of manufacturing an IC device, according to some example embodiments. FIGS. 13A to 13E are cross-sectional views of a sequence of processes on partial regions of regions corresponding to the cross-section taken along the line X2-X2' of FIG. 2A. An example method of manufacturing the IC device 300 shown in FIG. 4 will be described with reference to FIGS. 13A to 13E. Although FIGS. 13A to 13E illustrate a sequence of processes on a partial region of a second device region RX2, substantially the same processes as described below may be performed on a first device region RX1. In FIGS. 13A to 13E, the same reference numerals are used to denote the same elements as in FIGS. 11A to 11J, and repeated descriptions thereof will be omitted.

Figure 13A:
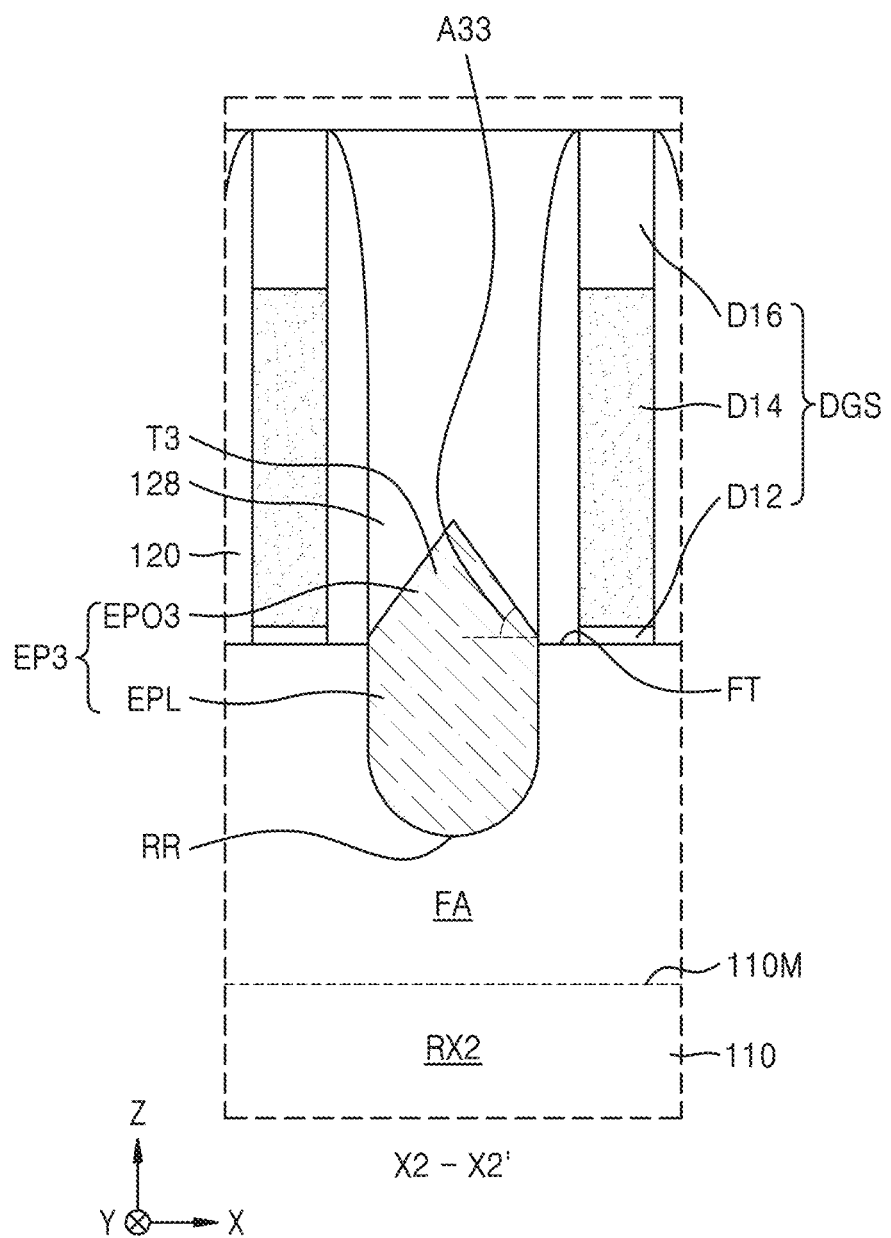
FIGS. 13A to 13E are cross-sectional views of a process sequence of a method of manufacturing an IC device, according to some example embodiments.

Referring to FIG. 13A, a plurality of fin-type active regions FA, a device isolation film 112, and a device isolation insulating film 114 may be formed on a substrate 110 using the same method as described with reference to FIG. 11A, and a plurality of dummy gate structures DGS and a plurality of insulating spacers 120 may be formed using the same method as described with reference to FIG. 11B. Thereafter, a recess region RR may be formed in the plurality of fin-type active regions FA.

Afterwards, an epitaxial film EP3 may be formed in the first device region RX1 and the second device region RX2 to fill the recess region RR. The epitaxial film EP3 may include a lower epitaxial portion EPL and an overgrowth portion EPO3, which protrudes from the lower epitaxial portion EPL to a level higher than a level of a fin top surface FT of the fin-type active region FA in a vertical direction (Z direction).

The overgrowth portion EPO3 of the epitaxial film EP3 may have an upper facet T3. The upper facet T3 may be formed to extend in an inclined direction, which intersects with a direction in which a main surface 110M of the substrate 110 extends, at a level higher than the level of the fin top surface FT of the fin-type active region FA. In some example embodiments, an angle A33 between the upper facet T3 and a horizontal line parallel to the main surface 110M of the substrate 110 may be in a range of about 30° to about 40°, without being limited thereto. For example, the upper facet T3 may have a {111} plane orientation. A detailed configuration of the epitaxial film EP3 may be substantially the same as that of the epitaxial film EP2, which is described with reference to FIG. 12A. However, the upper facet T3 included in the overgrown portion EPO3 of the epitaxial film EP3 may be formed adjacent to the fin top surface FT of the fin-type active region FA.

After the epitaxial film EP3 is formed in each of the first device region RX1 and the second device region RX2, an inter-gate dielectric film 128 may be formed between the plurality of dummy gate structures DGS to cover the epitaxial film EP3. After the inter-gate dielectric film 128 is formed, a top surface of a dummy insulating capping layer D16 may be exposed.

Figure 13B:
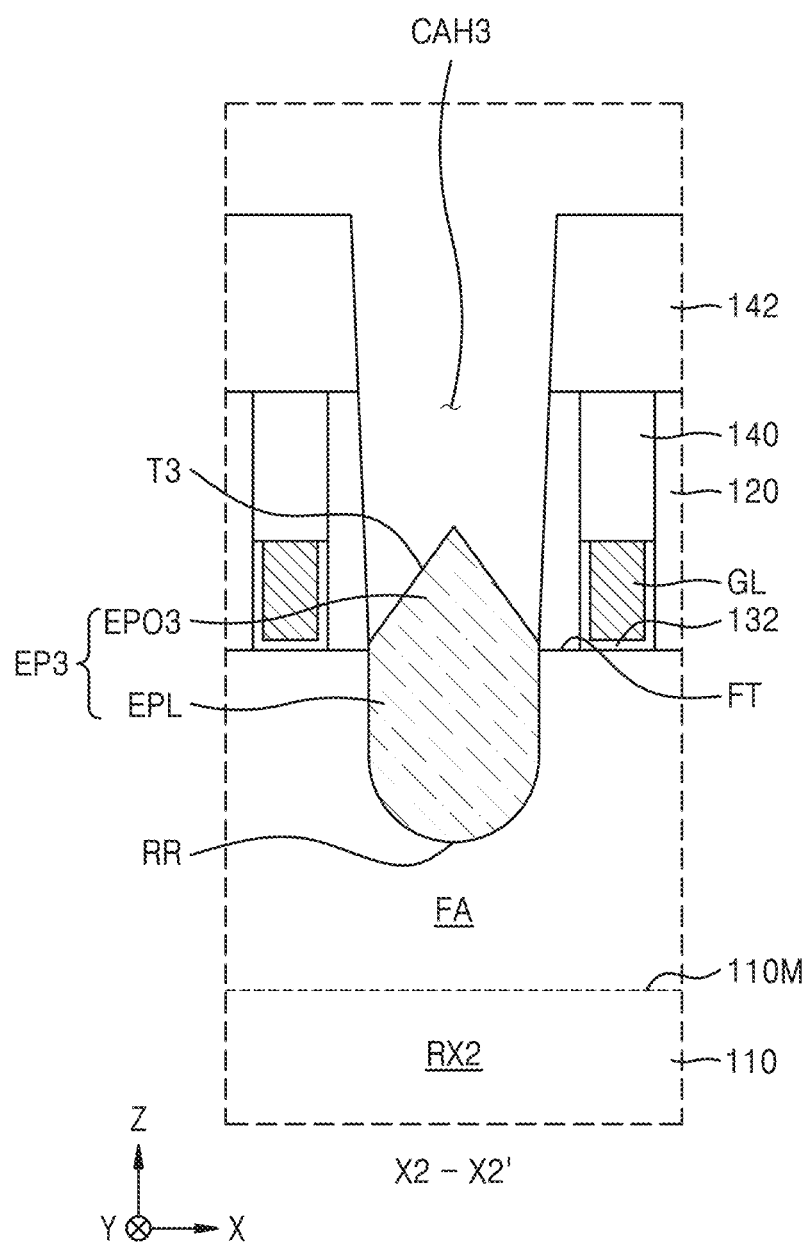

Referring to FIG. 13B, in the resultant structure of FIG. 13A, a gate insulating film 132, a gate line GL, and an insulating capping line 140 may be formed on the substrate 110 using a method similar to that described with reference to FIGS. 11C to 11F, and an upper insulating film 142 may be formed to cover a top surface of each of the insulating capping line 140 and the inter-gate dielectric film 128. Thereafter, a source/drain contact hole CAH3 may be formed to pass through the upper insulating film 142 and the inter-gate dielectric film 128 and expose the overgrowth portion EPO3 of the epitaxial film EP3.

Figure 13C:
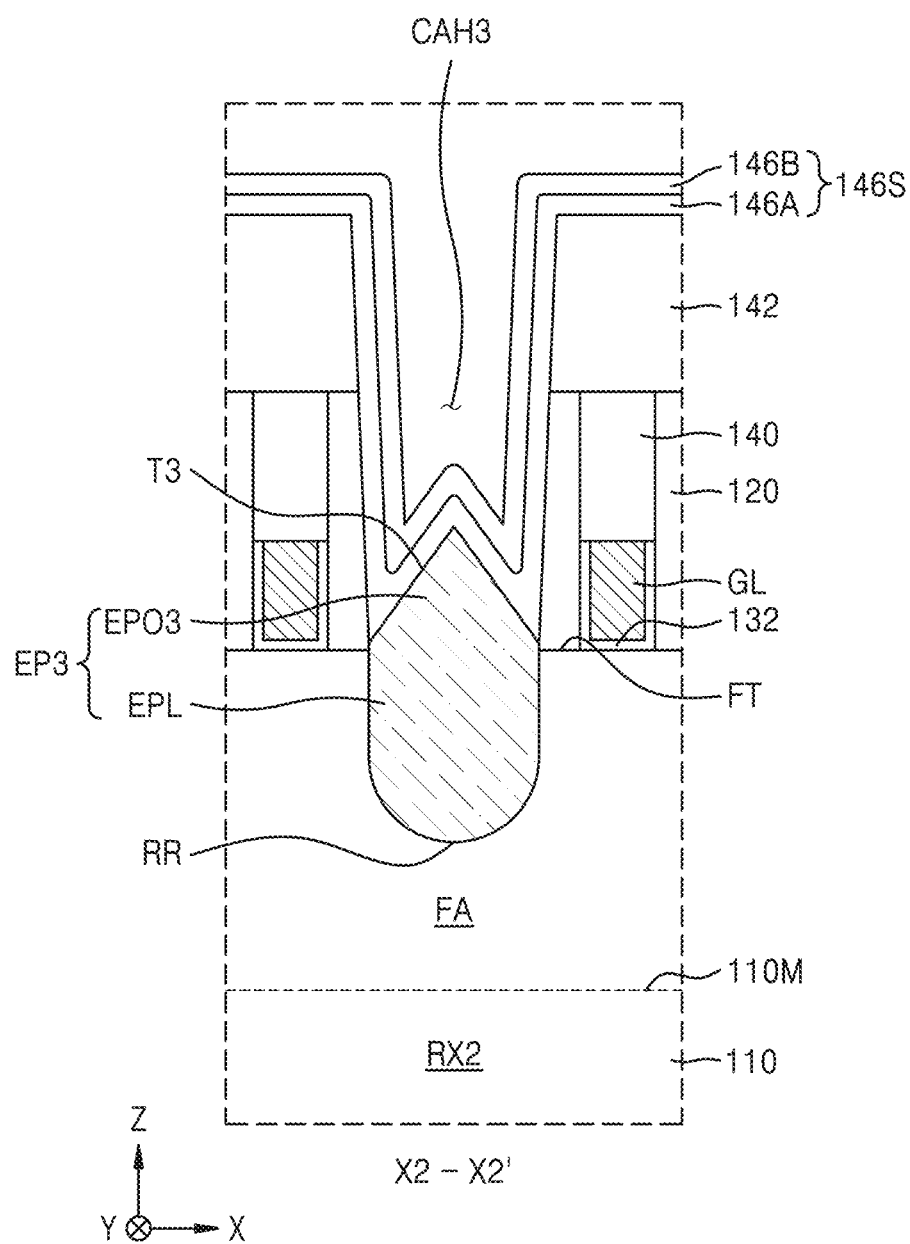

Referring to FIG. 13C, an insulating liner structure 146S ma be formed inside the source/drain contact hole CAH3 in the resultant structure of FIG. 13B, by using a method similar to that described with reference to FIG. 11G.

Figure 13D:
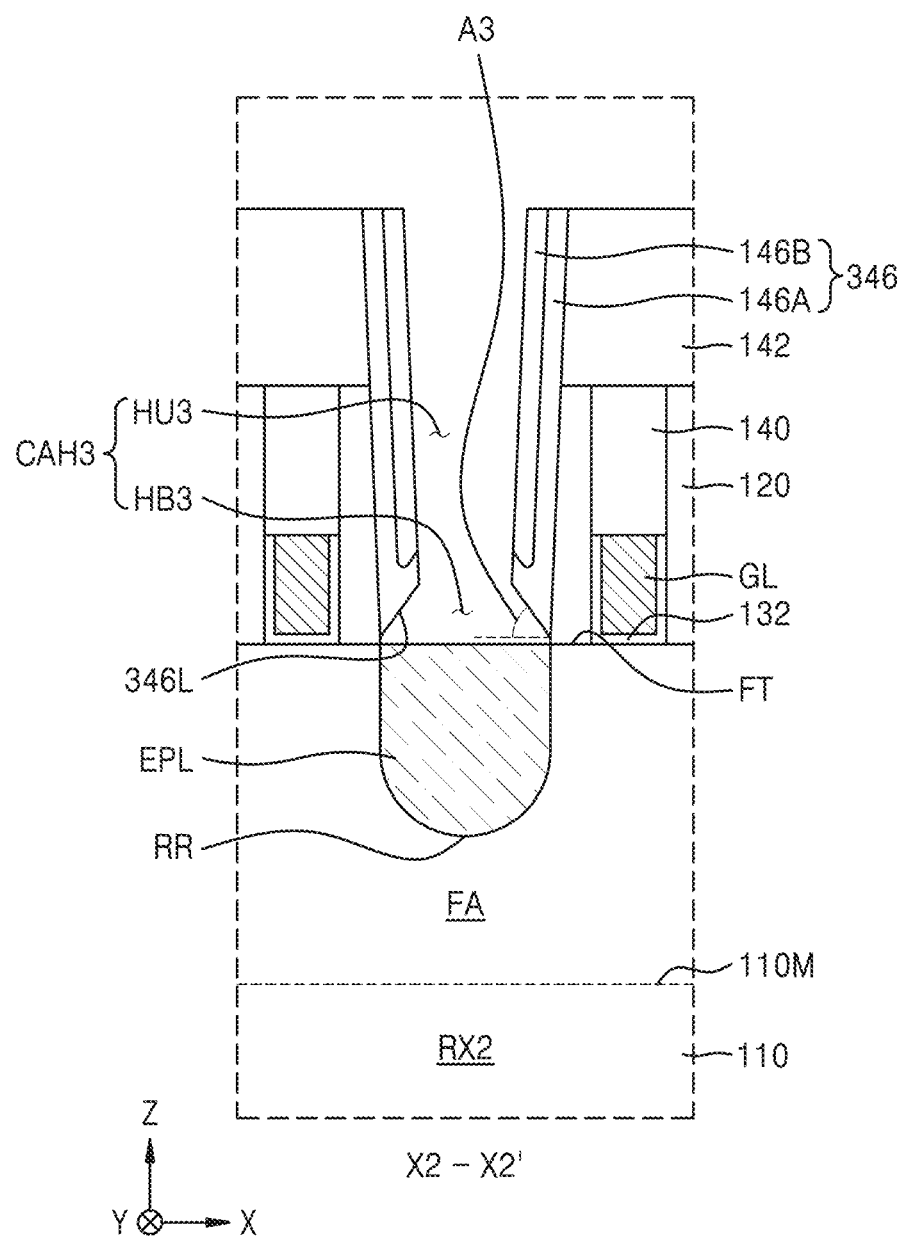

Referring to FIG. 13D, by using substantially the same method as that described with reference to FIG. 11H, the insulating liner structure 146S may be anisotropically etched in the resultant structure of FIG. 13C, and thus, an insulating liner 346 may be formed from the insulating liner structure 146S to expose the epitaxial film EP3. Also, the overgrowth portion EPO3 of the exposed epitaxial film EP3 may be continuously etched using an anisotropic etching process and thus removed. As a result, the source/drain contact hole CAH3 may expand and include an upper hole portion HU3 and a bottom hole portion HB3. The upper hole portion HU3 may be defined by an insulating liner 246. The bottom hole portion HB3 may be connected to the upper hole portion HU3 and be at a lower portion relatively close to the substrate 110.

After the overgrowth portion EPO3 of the epitaxial film EP3 is removed, a sidewall of the insulating spacer 120, a bottom surface 346L of the insulating liner 346, and the lower epitaxial portion EPL may be exposed at the bottom hole portion HB3 of the source/drain contact hole CAH3. The bottom surface 346L of the insulating liner 346 may include an inclined bottom surface. An angle A3 between the inclined bottom surface included in the bottom surface 346L of the insulating liner 346 and a horizontal line parallel to the main surface 110M of the substrate 110 may be in a range of about 30° to about 40°, without being limited thereto.

Figure 13E:
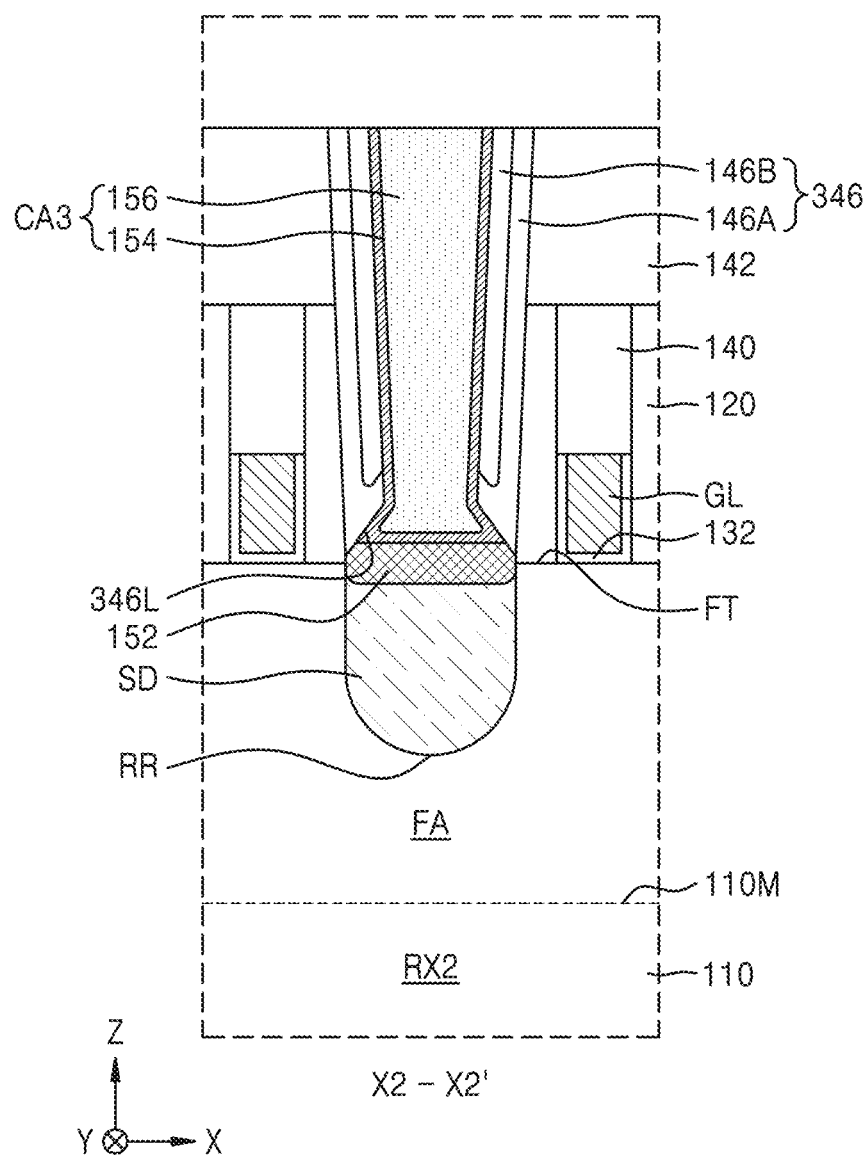

Referring to FIG. 13E, in the resultant structure of FIG. 13D, the metal silicide film 152 may be formed on the lower epitaxial portion EPL by using substantially the same method as that described with reference to FIG. 11I. A source/drain contact CA3 may be formed to fill the bottom hole portion HB3 and the upper hole portion HU3 of the source/drain contact hole CAH3 by using substantially the same method as that described with reference to FIG. 11J. Afterwards, subsequent processes described with reference to FIG. 11J may be performed, and thus, the IC device 300 described with reference to FIG. 4 may be manufactured.

Although example methods of manufacturing the IC devices 100, 200, and 300 have been described with reference to FIGS. 11A to 11J, 12A to 12E, and 13A to 13E, it will be understood that the IC device 400 shown in FIGS. 5 to 7, the IC device 900 shown in FIGS. 8 to 10, and various IC devices having similar structures thereto may be manufactured by making various modifications and changes in some example embodiments as described with reference to FIGS. 11A to 11J, 12A to 12E, and 13A to 13E within the scope of the inventive concept.

While the inventive concept has been particularly shown and described with reference to some example embodiments thereof, it will be understood that various changes in form and details may be made therein without departing from the spirit and scope of the following claims.

What is claimed is:

1. An integrated circuit device comprising:
    a fin-type active region extending in a first lateral direction on a substrate;
    a gate line extending in a second lateral direction, the gate line being on the fin-type active region, the second lateral direction intersecting with the first lateral direction;
    an insulating spacer covering a sidewall of the gate line;
    a source/drain region connected to the fin-type active region adjacent to the gate line and spaced apart from the insulating spacer, the source/drain region having a dopant profile different from a dopant profile of the fin-type active region;
    a metal silicide film covering a top surface of the source/drain region; and
    a source/drain contact apart from the gate line with the insulating spacer therebetween in the first lateral direction, the source/drain contact being connected to the source/drain region through the metal silicide film,
the source/drain contact including a bottom contact segment and an upper contact segment, the bottom contact segment having a contact surface in contact with a top surface of the metal silicide film, the upper contact segment being apart from the metal silicide film with the bottom contact segment therebetween in a vertical direction, the upper contact segment being integrally connected to the bottom contact segment, wherein a width of the bottom contact segment is greater than a width of at least a portion of the upper contact segment in the first lateral direction,
the metal silicide film contacting the insulating spacer and a region of the fin-type active region having the dopant profile of the fin-type active region.

2. The integrated circuit device of claim 1, wherein the bottom contact segment of the source/drain contact includes a portion protruding from a lower end of the upper contact segment toward the gate line.

3. The integrated circuit device of claim 1, wherein, in the first lateral direction, a width of the contact surface of the bottom contact segment is equal to a width of the metal silicide film and greater than a minimum width of the upper contact segment.

4. The integrated circuit device of claim 1, wherein, in the first lateral direction, a width of the contact surface of the bottom contact segment is less than a width of the metal silicide film and greater than a minimum width of the upper contact segment.

5. The integrated circuit device of claim 1, wherein each of the bottom contact segment of the source/drain contact and the metal silicide film includes a portion in contact with the insulating spacer.

6. The integrated circuit device of claim 1, the integrated circuit device further comprising an insulating liner between the insulating spacer and the upper contact segment of the source/drain contact,
wherein the bottom contact segment of the source/drain contact includes a portion between the metal silicide film and the insulating liner in the vertical direction.

7. The integrated circuit device of claim 1, the integrated circuit device further comprising an insulating liner between the insulating spacer and the upper contact segment of the source/drain contact,
wherein a bottom surface of the insulating liner, which faces the substrate, includes a horizontal plane extending in the first lateral direction at a position apart from the metal silicide film in the vertical direction.

8. The integrated circuit device of claim 1, the integrated circuit device further comprising an insulating liner between the insulating spacer and the upper contact segment of the source/drain contact,
wherein
a bottom surface of the insulating liner, which faces the substrate, includes an inclined bottom surface extending in an inclined direction that intersects with the first lateral direction, and
the bottom contact segment includes an inclined outer wall in contact with the inclined bottom surface.

9. The integrated circuit device of claim 1, the integrated circuit device further comprising an insulating liner between the insulating spacer and the upper contact segment of the source/drain contact,
wherein a bottom surface of the insulating liner, which faces the substrate, includes an inclined bottom surface extending in an inclined direction that intersects with the first lateral direction at a position apart from the metal silicide film in the vertical direction.

10. The integrated circuit device of claim 1, the integrated circuit device further comprising an insulating liner between the insulating spacer and the upper contact segment of the source/drain contact,
wherein a bottom surface of the insulating liner, which faces the substrate, includes an inclined bottom surface in contact with the metal silicide film.

11. The integrated circuit device of claim 1, a maximum width of the metal silicide film is greater than or equal to a maximum width of the source/drain contact in the first lateral direction.

12. An integrated circuit device comprising:
a fin-type active region extending in a first lateral direction on a substrate;
a recess region defined by the fin-type active region;
a pair of gate lines apart from each other with the recess region therebetween, the pair of gate lines extending in a second lateral direction on the fin-type active region, the second lateral direction intersecting with the first lateral direction;
a pair of insulating spacers covering sidewalls of each of the pair of gate lines;
a source/drain region in the recess region, connected to the fin-type active region adjacent to the gate line and spaced apart from the pair of insulating spacers, the source/drain region having a dopant profile different from a dopant profile of the fin-type active region;
a metal silicide film covering a top surface of the source/drain region; and
a source/drain contact between the pair of gate lines, the source/drain contact being connected to the source/drain region through the metal silicide film, the source/drain contact including a bottom contact segment and an upper contact segment, the bottom contact segment having a contact surface in contact with a top surface of the metal silicide film, the upper contact segment being apart from the metal silicide film with the bottom contact segment therebetween in a vertical direction, the upper contact segment being integrally connected to the bottom contact segment, a width of the bottom contact segment is greater than a width of at least a portion of the upper contact segment in the first lateral direction,
the metal silicide film contacting the pair of insulating spacers and a region of the fin-type active region having the dopant profile of the fin-type active region.

13. The integrated circuit device of claim 12, wherein the bottom contact segment of the source/drain contact includes portions protruding in opposite directions from a lower end of the upper contact segment toward the pair of gate lines in the first lateral direction.

14. The integrated circuit device of claim 12, wherein the metal silicide film is in contact with the pair of insulating spacers.

15. The integrated circuit device of claim 12, the integrated circuit device further comprising an insulating liner between the pair of insulating spacers, the insulating liner covering a sidewall of the upper contact segment of the source/drain contact,
wherein the metal silicide film is in contact with each of the pair of insulating spacers and apart from the insulating liner in the vertical direction, and
the bottom contact segment of the source/drain contact is in contact with each of the pair of insulating spacers.

16. The integrated circuit device of claim 12, the integrated circuit device further comprising an insulating liner between the pair of insulating spacers, the insulating liner covering a sidewall of the upper contact segment of the source/drain contact, and
   the metal silicide film is in contact with each of the pair of insulating spacers and the insulating liner.

17. The integrated circuit device of claim 12, the integrated circuit device further comprising an insulating liner between the pair of insulating spacers, the insulating liner covering a sidewall of the upper contact segment of the source/drain contact,
   wherein the insulating liner is apart from the metal silicide film with the bottom contact segment of the source/drain contact therebetween in the vertical direction.

18. The integrated circuit device of claim 12, the integrated circuit device further comprising an insulating liner between the pair of insulating spacers, the insulating liner covering a sidewall of the upper contact segment of the source/drain contact,
   wherein a bottom surface of the insulating liner comprises a portion in contact with the metal silicide film and a portion in contact with the bottom contact segment of the source/drain contact.

* * * * *